United States Patent [19]
Haq

[11] Patent Number: 6,151,648
[45] Date of Patent: Nov. 21, 2000

[54] HIGH SPEED BUS SYSTEM AND METHOD FOR USING VOLTAGE AND TIMING OSCILLATING REFERENCES FOR SIGNAL DETECTION

[75] Inventor: Ejaz Ul Haq, Sunnyvale, Calif.

[73] Assignee: Jazio, Inc., Sunnyvale, Calif.

[21] Appl. No.: 09/165,705

[22] Filed: Oct. 2, 1998

Related U.S. Application Data

[60] Provisional application No. 60/078,213, Mar. 16, 1998.
[51] Int. Cl.[7] .................................................. G06F 13/00
[52] U.S. Cl. ...................... 710/107; 710/104; 710/110; 710/128; 710/126; 710/33; 712/31; 712/28; 712/36
[58] Field of Search .................................. 710/107, 110, 710/126, 129, 33, 35, 119, 123, 241, 104, 105; 712/31, 28, 29, 36

[56] References Cited

U.S. PATENT DOCUMENTS 4,247,817  1/1981  Heller .
4,663,769  5/1987  Krinock .................................. 375/110

(List continued on next page.)

FOREIGN PATENT DOCUMENTS

WO92/17938  10/1992  WIPO .

OTHER PUBLICATIONS

4M×18 SLDRAM Preliminary Data Sheet Sep. 1997 from SLDRAM Consortium.

1M×16×4 Banks DDR SDRAM Jun. 1997 from Samsung.

Kim et al. "A 640MB/s Bi–Directional Data Strobed,, Double–Data–Rate SDRAM with a 40mw DLL Circuit for a 256MB Memory System", ISSCC98 Digest pp. 158–159 Feb. 1998.

Morooka et al., "Source Synchronization and Timing Vernier Techniques for 1.2GB/s SLDRAM Interface", ISSCC98 Digest pp. 160–161 Feb. 1998.

B. Lau et al. "A 2.6GB/s/Multi–Purpose Chip–to–Chip Interface", ISSCC98 Digest pp. 162–163 Feb. 1998.

LVDS I/O (Scalable Coherent Interface Documents) IEEE P1596.3 working–group activity for high–speed signal link interface.

(List continued on next page.)

*Primary Examiner*—Ayaz R. Sheikh
*Assistant Examiner*—Raymond N Phan
*Attorney, Agent, or Firm*—Squire, Sanders & Dempsey L.L.P.

[57] ABSTRACT

A system of the present invention uses small swing differential source synchronous voltage and timing reference (SSVTR and /SSVTR) signals to compare single-ended signals of the same slew rate generated at the same time from the same integrated circuit for high frequency signaling. The SSVTR and /SSVTR signals toggle every time the valid signals are driven by the transmitting integrated circuit. Each signal receiver includes two comparators, one for comparing the signal against SSVTR and the other for comparing the signal against /SSVTR. A present signal binary value determines which comparator is coupled to the receiver output, optionally by using XOR logic with SSVTR and /SSVTR. The coupled comparator in the receiver detects whether change in signal binary value occurred or not until SSVTR and /SSVTR have changed their binary value. The same comparator is coupled if the signal transitions. The comparator is de-coupled if no transition occurs. The system may use a first set of oscillating references on a first bus for detecting transitions in control information and a second set of oscillating references for detecting transitions in data information.

25 Claims, 32 Drawing Sheets

U.S. PATENT DOCUMENTS

| | | |
|---|---|---|
| 4,745,365 | 5/1988 | Ugenti . |
| 4,792,845 | 12/1988 | Judge ......................................... 358/10 |
| 5,023,488 | 6/1991 | Gunning . |
| 5,105,107 | 4/1992 | Wilcox . |
| 5,243,703 | 9/1993 | Farmwald et al. . |
| 5,254,883 | 10/1993 | Horowitz et al. . |
| 5,263,049 | 11/1993 | Wincn . |
| 5,319,755 | 6/1994 | Farmwald et al. . |
| 5,355,391 | 10/1994 | Horowitz et al. .......................... 375/36 |
| 5,363,332 | 11/1994 | Murabayashi et al. . |
| 5,378,946 | 1/1995 | Reime ........................................ 327/14 |
| 5,408,129 | 4/1995 | Farmwald et al. . |
| 5,432,823 | 7/1995 | Gasbarro et al. . |
| 5,473,575 | 12/1995 | Farmwald et al. . |
| 5,473,635 | 12/1995 | Chevroulet .............................. 375/287 |
| 5,485,575 | 1/1996 | Chess et al. ........................ 395/183.14 |
| 5,498,985 | 3/1996 | Parle et al. . |
| 5,512,853 | 4/1996 | Ueno et al. . |
| 5,513,327 | 4/1996 | Farmwald et al. . |
| 5,513,377 | 4/1996 | Capowski et al. . |
| 5,550,496 | 8/1996 | Desroches . |
| 5,579,492 | 11/1996 | Gay ........................................ 710/119 |
| 5,590,369 | 12/1996 | Burgess et al. ............................ 712/1 |
| 5,606,717 | 2/1997 | Farmwald et al. . |
| 5,638,446 | 6/1997 | Rubin ........................................ 380/25 |
| 5,646,642 | 7/1997 | Maekawa et al. . |
| 5,706,484 | 1/1998 | Mozdzen et al. . |
| 5,715,405 | 2/1998 | McClear et al. ......................... 395/280 |
| 5,724,425 | 3/1998 | Chang et al. .............................. 380/25 |
| 5,774,354 | 6/1998 | Ohta ........................................ 364/131 |
| 5,796,962 | 8/1998 | Fant et al. ................................ 710/126 |
| 5,832,208 | 11/1998 | Chen et al. ......................... 395/187.01 |
| 5,850,559 | 12/1998 | Angelo et al. ...................... 395/750.03 |
| 5,878,234 | 3/1999 | Dutkiewicz et al. ................... 710/119 |
| 5,925,118 | 7/1999 | Revilla et al. ........................... 710/110 |
| 5,928,343 | 7/1999 | Farmwald et al. ...................... 710/104 |

OTHER PUBLICATIONS

Hyper–LVDS I/O Cells (LSI Logic Product Briefs).

Richard Crisp, "Direct Rambus Technology: The New Main Memory Standard", Nov./Dec. 1997 issue of IEEE Micro.

Direct RDRAM 64/72 Mbit (256K×16/18×16d) , "Advance Information" of 64M/72M Direct RDRAM Data Sheet, dated Oct. 2, 1997.

Tamura et al., "PRD–Based Global–Mean–Time Signaling for High–Speed Chip–to–Chip Communications", ISSCC98 Digest, pp. 164–165 & pp. 430–432; Feb. 1998.

Griffin et al., "A Process Independent 800MB/s DRAM Bytewide Interface Featuring Command Interleaving and Concurrent Memory Operation", ISSCC98 Digest, pp. 156–157 Feb. 1998.

RamLink, LVDS I/O (Scalable Coherent Interface Documents) IEEE P1596.4 working–group activity for high–speed signal link interface.

Xilinx Application Note: "Using the Virtex SelectIO", XAPP 133 Oct. 21, 1998 (Version 1.11), 12 pages.

Web page: http://iel.ihs.com:80/cgi–bin/iel_cgi?se . . . 2ehts%26ViewTemplate%3ddocview%5fb%2ehts, Okamoto, E. et al., "ID–Based Authentication System For Computer Virus Detection", IEEE/IEE Electronic Library online, Electronics Letters, vol. 26, Issue 15, ISSN 0013–5194, Jul. 19, 1990, Abstract and pp. 1169–1170.

"IEEE Standard For Low–Voltage Differential Signals (LVDS) For Scalable Coherent Interface (SCI)", IEEE Std. 1596.Mar. 1996, Mar. 21, 1996, XP002106653, Introduction, Contents and pp. 1–30.

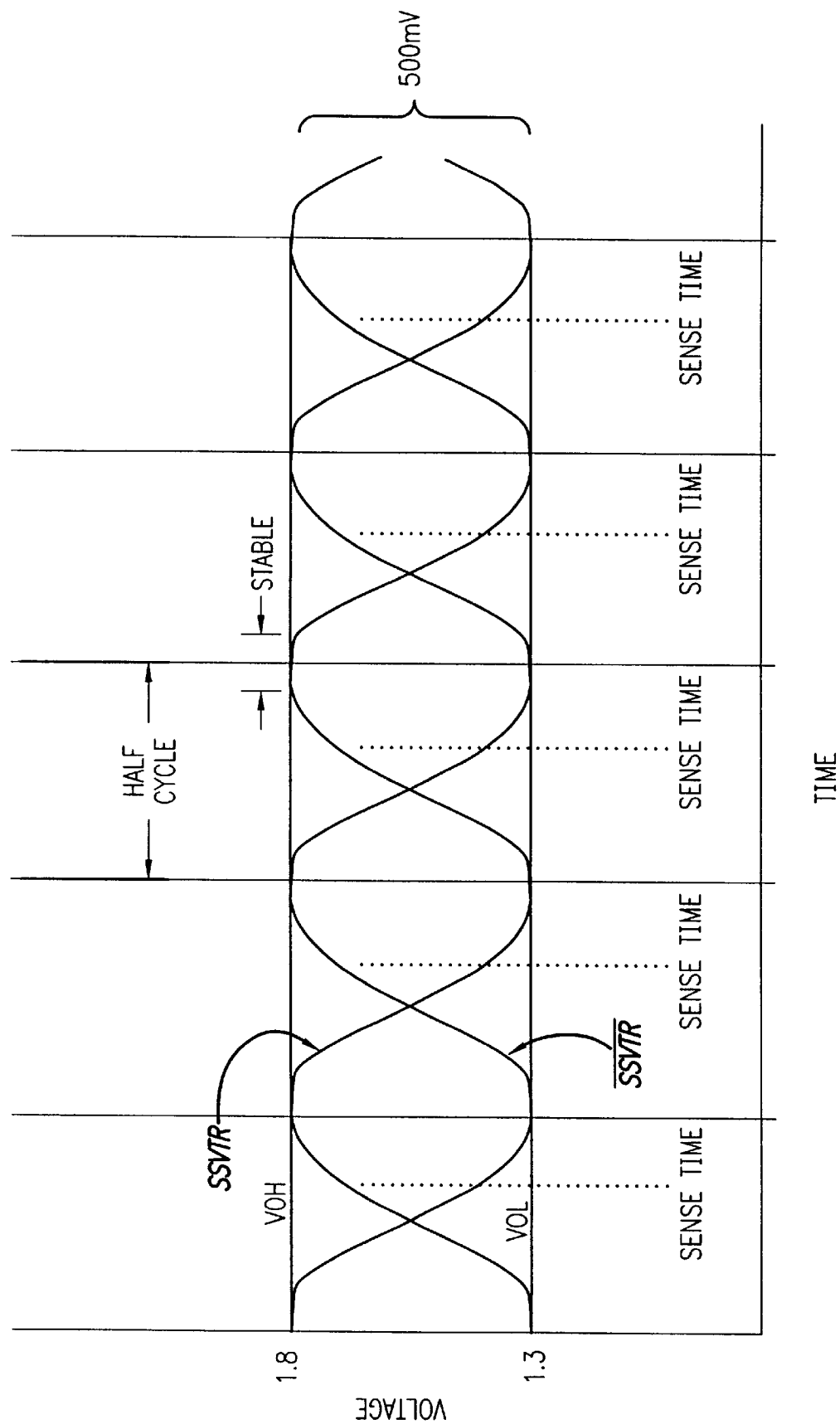

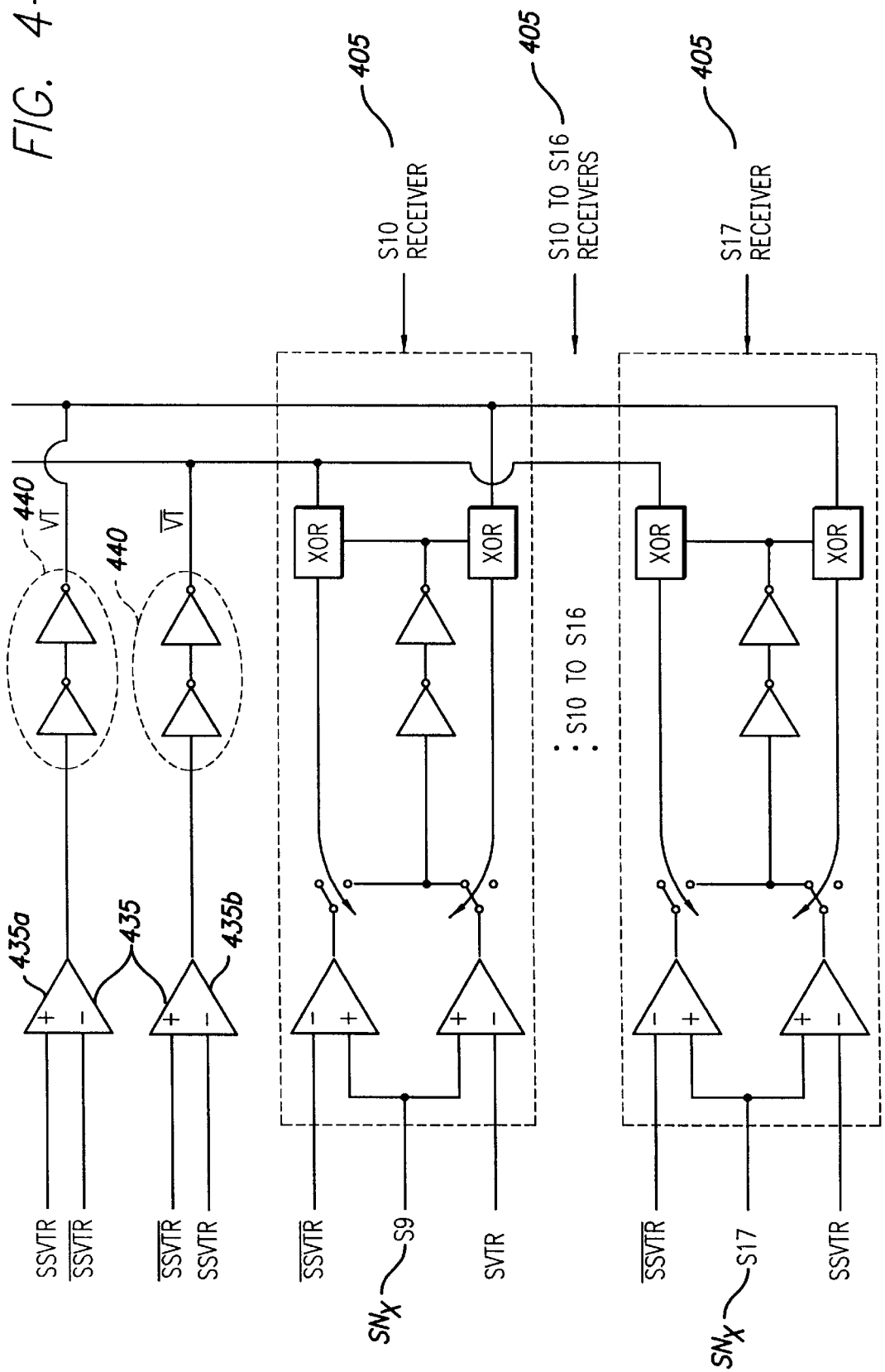

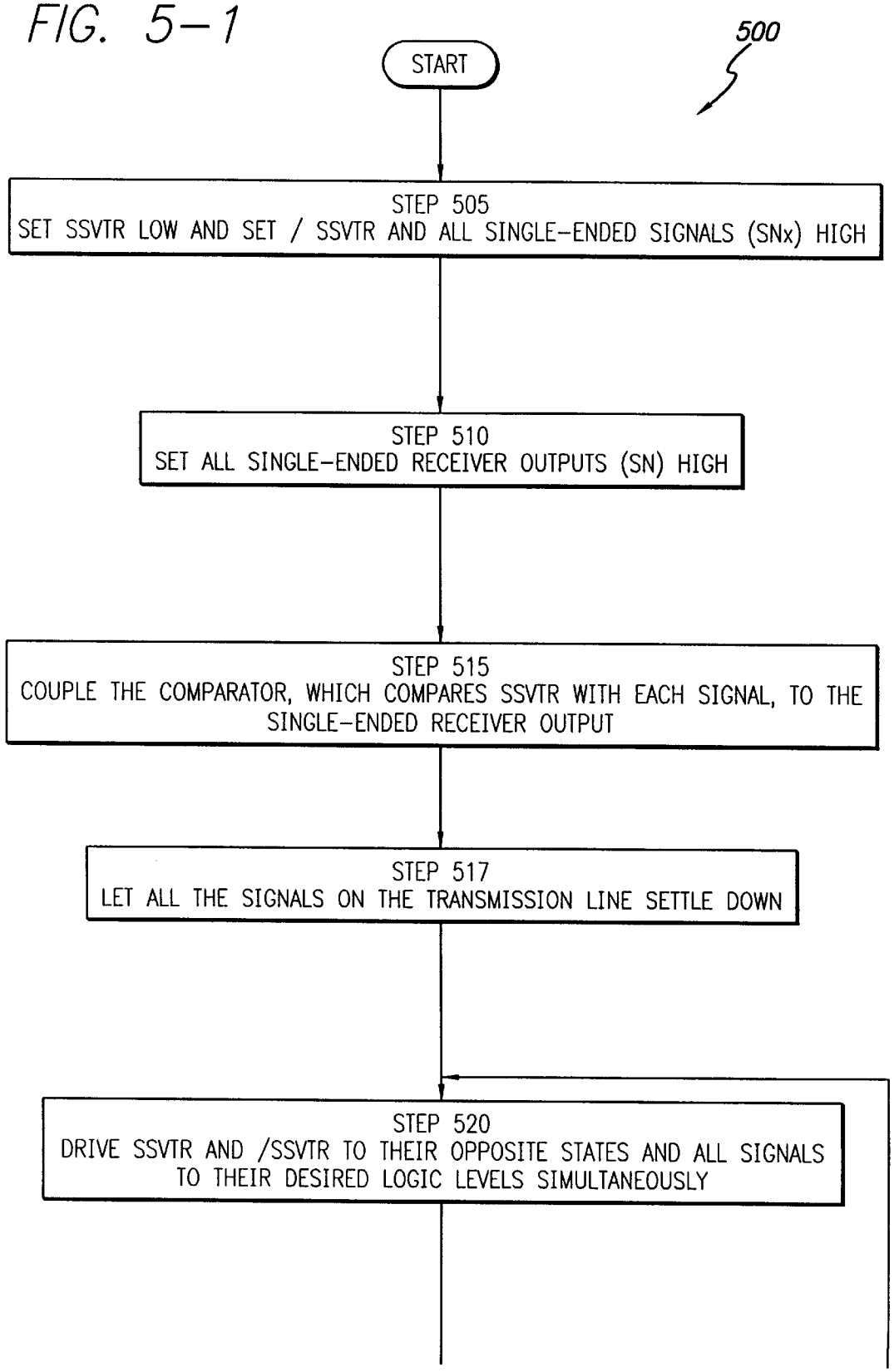

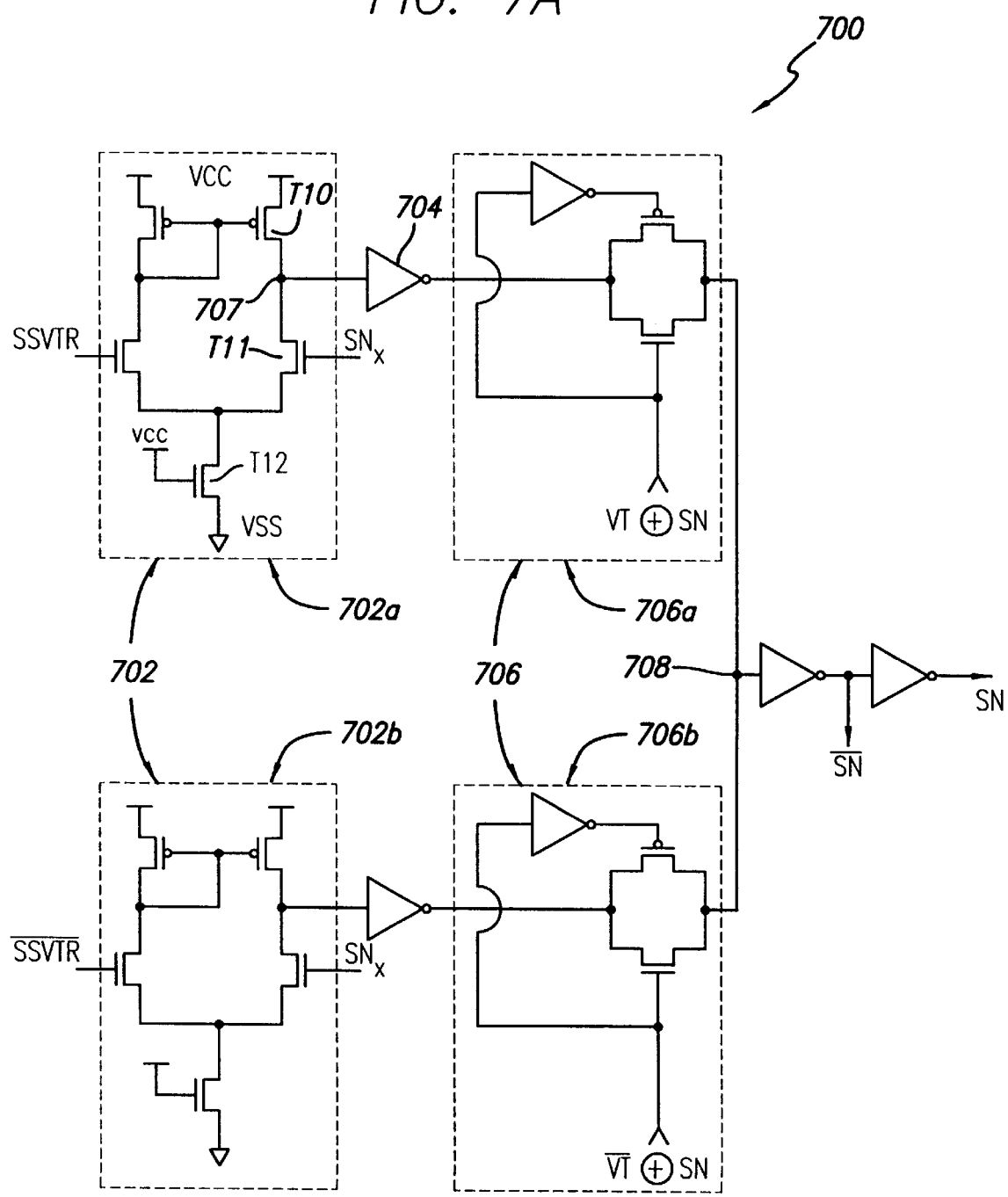

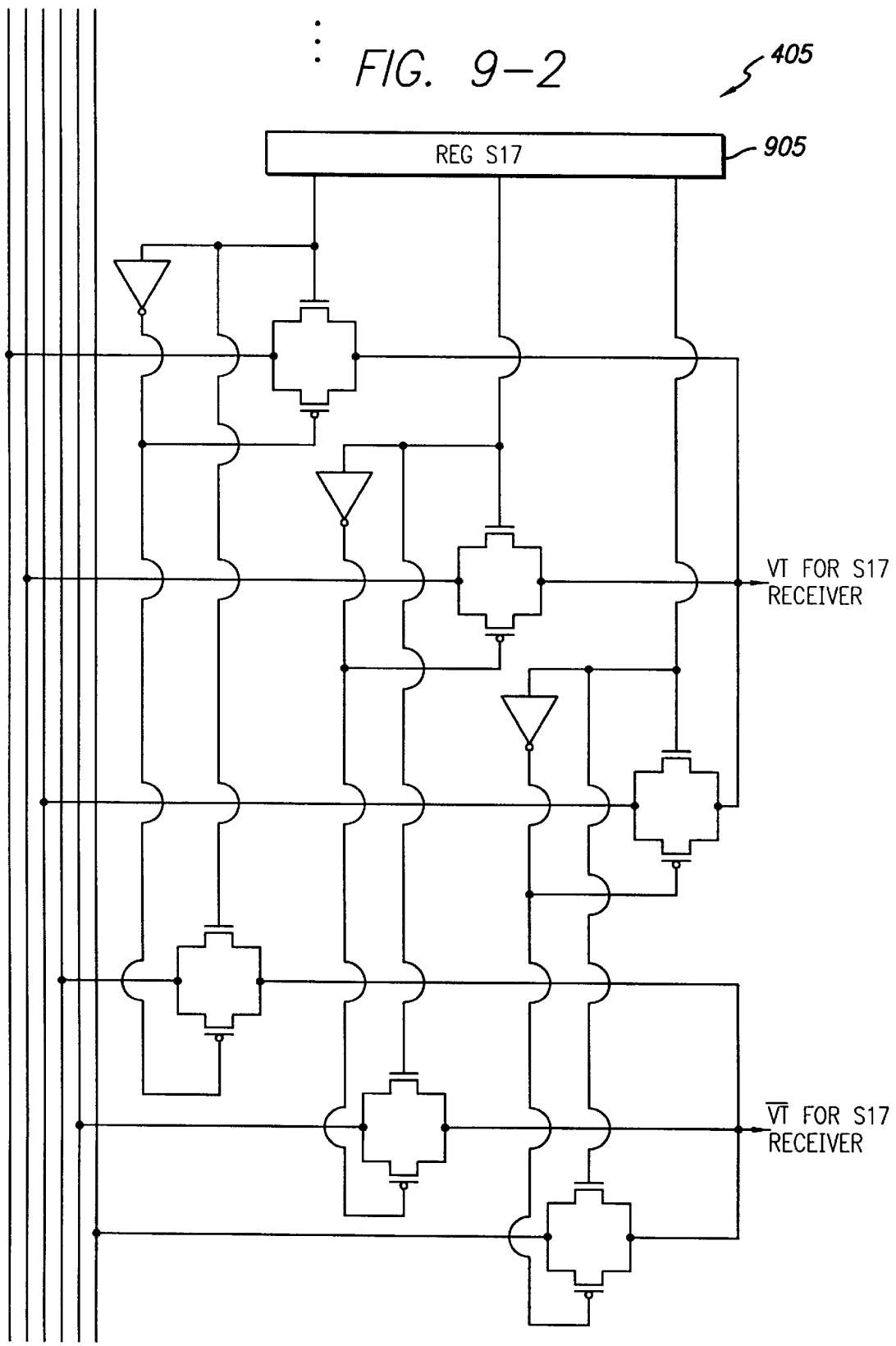

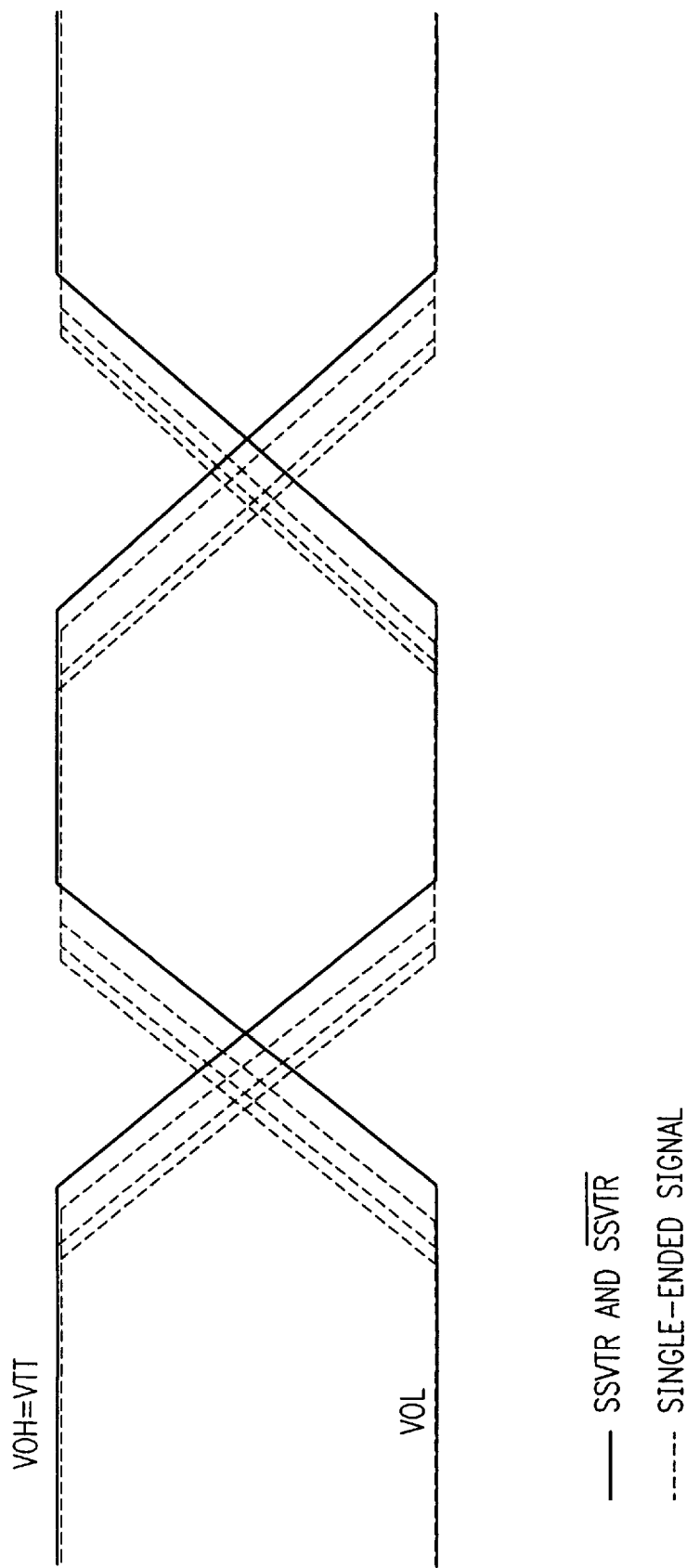

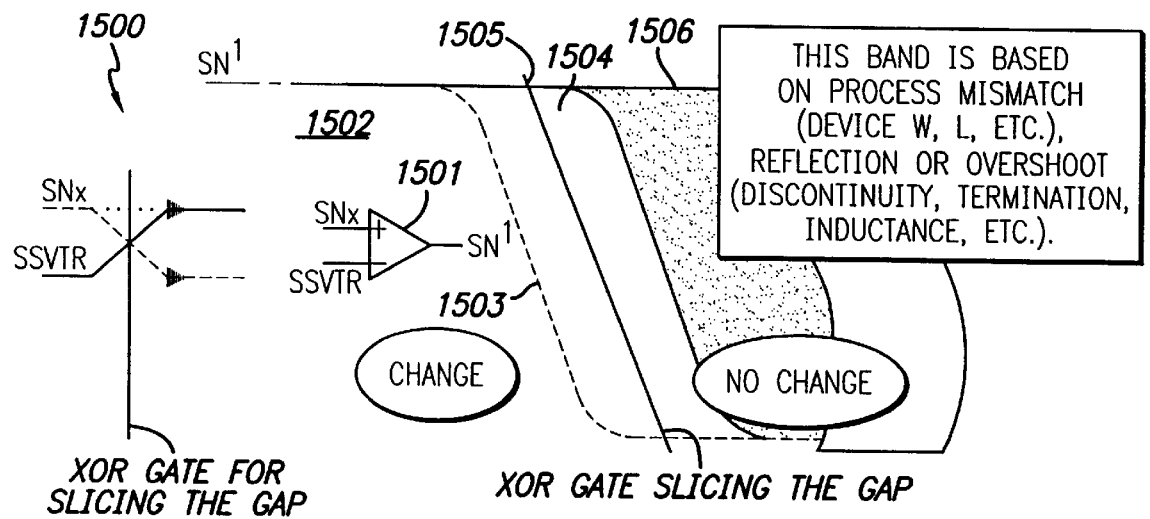
FIG. 15A SIGNAL CHANGE DISCRIMINATOR
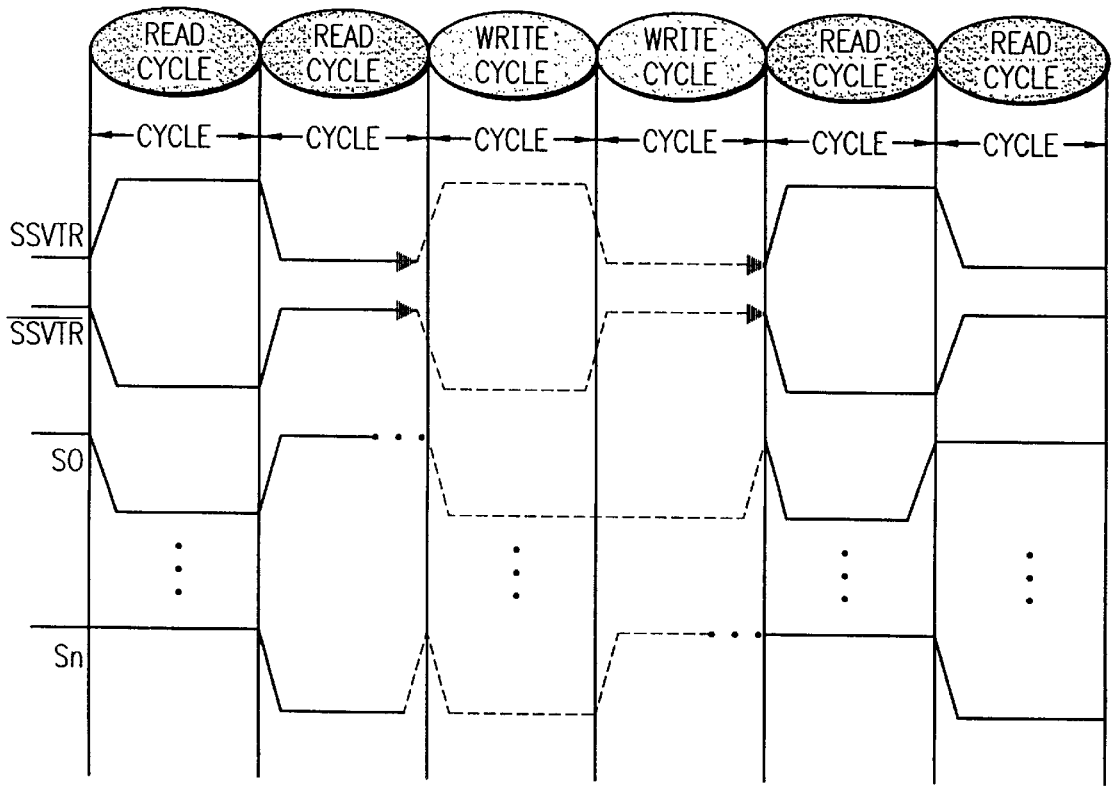
FIG. 17
BI-DIRECTIONAL TIMING FOR BUS TURN AROUND

STEERING LOGIC

HIGH SPEED BUS SYSTEM AND METHOD FOR USING VOLTAGE AND TIMING OSCILLATING REFERENCES FOR SIGNAL DETECTION

PRIORITY REFERENCE TO PROVISIONAL APPLICATION

This application claims benefit of and incorporates by reference provisional patent application Serial No. 60/078,213, entitled "High Speed Source Synchronous Signaling For Interfacing VLSI CMOS Circuits To Transmission Lines," filed on Mar. 16, 1998, by inventor Ejaz Ul Haq; and claims benefit of and incorporates by reference patent application Ser. No. 09/057,158, entitled "High Speed Source Synchronous Signaling For Interfacing VLSI CMOS Circuits To Transmission Lines," filed on Apr. 7, 1998, by inventor Ejaz Ul Haq.

BACKGROUND OF THE INVENTION

1. Field of the Invention

This invention relates generally to computer signal communication, and more particularly to an integrated circuit interface and method for high speed block transfer signaling of data, control and address signals between multiple integrated circuits on a bus or point-to-point with reduced power consumption.

2. Description of the Background Art

Semiconductor integrated circuits used in digital computing and other digital applications often use a plurality of Very Large Scale Integration (VLSI) interconnected circuits for implementing binary communication across single or multi-segmented transmission lines. Conventional transmission lines include traces, which are formed on a suitable substrate, such as a printed circuit board. Each transmission line may be designed, for example, using so-called microstrip traces and strip line traces to form a transmission line having a characteristic impedance on the order of about 50–70 ohms. Alternatively, each transmission line may have its opposite ends terminated in their characteristic impedance. The output load on a driver for such a transmission line may be as low as 25–35 ohms.

To consume reasonable power, high frequency signaling requires small amplitude signals. For a receiver to detect voltage swings (e.g., 0.8 v to 1.2 v) easily in a noisy environment like GTL, HSTL, SSTL or RAMBUS, the current must also be very large (e.g., on the order of 50 to 60 milliamps per driver). A typical receiver uses a comparator with a voltage reference (VREF) signal configured midway between input high voltage (VIH) and input low voltage (VIL). The VREF signal is a high impedance DC voltage reference which tracks loosely with power supplies over time, but cannot respond to instantaneous noise. Conventionally, High Output Voltage (VOH) and Low Output Voltage (VOL) denote signals emerging from the transmitting source, and VIL and VIH denote signals arriving at the input of the receiving device, although they can be considered the same signal.

FIG. 1A is a block diagram illustrating a prior art receiver 10 using RAMBUS technology. The system 10 includes a pad 100 coupled via signal lines 103 to internal input receivers 110. A VREF signal 105 is coupled to each internal receiver 110. VREF is generated from the power supply. Usually, the DC value of the power supply varies by five percent (5%). FIG. 1B is a timing diagram 125 illustrating an example signal relative to a high reference voltage (VREFh) and a low reference voltage (VREFl). The VREFh and VREFl values typically depend on power supply variation used to generate the VREF signal. The large voltage swing, i.e., the difference between a high voltage signal (VIH) and a low voltage signal (VIL), and stable signal levels above and below the VREF signal are required for reliable detection of signal polarity. The voltage swing of current single-ended signaling technologies is conventionally around 0.8 v.

FIG. 1C is a block diagram illustrating schematics of a prior art receiver 150 using RAMBUS technology. The receiver 150 samples the level of input signal 167 and of the VREF signal 154 until the signal reaches a stable level, at which time the pass gates 160 and 165 turn off. Once the pass gates 160 and 165 turn off, the sense gate 172 is enabled to eliminate current injection. FIG. 1D is a timing diagram 175 illustrating operation of the receiver 150 for an example signal. The receiver 150 samples the input reference and input signal until the signal reaches a stable level, e.g., a low logic level (VIL), and, while the input signal is stable, the receiver 150 senses the value of the input signal. As stated above, for reliable signal detection, the signal voltage swing must be fast enough to allow all the receivers 150 to sample a stable signal with an adequate margin for set-up and hold time. This voltage swing should occur in less than 30% of the minimum cycle time to allow margin for signal skew, set-up and hold-times. As the minimum cycle time reduces below 1 nanosecond, the margins reduce for signal skew, set-up time and hold-time, with the additional burden on the driver current in a high capacitance loading environment operating at high frequency. Low voltage differential signaling (LVDS) used by IEEE P1596.3 can overcome these problems by using a 250 mv voltage swing at the expense of running complimentary signals. Running complementary signals inevitably increases the pin count and package size.

Further, computer systems typically utilize a bus system in which several devices are coupled to the bus. Most of them use a clock to validate data, address and control signals. FIG. 21 illustrates a prior art system 2100 for DRDRAM, which uses a clock line 2130 having two segments 2136 and 2138. One segment 2136 extends from one end of the data bus to a turnaround point 2137 near the second end of the bus. The other clock segment 2138 extends from the turnaround 2137 back to the first end of the data bus. The signal bus 2120 carries data, address and control signals. This topology ensures that a signal sent on the bus 2120 always travels contemporaneously with and in the same direction as the clock 2132 used by the device to receive the signal. This works fine if the loading off all signals and the clock is almost identical and the clock 2132 is used to sample and receive the signal. However, sometimes the system might require twice the data bandwidth in which case this type of bus system needs to double the number of signals even though the address and control signals are identical, and could have been shared.

Accordingly, there is a need for low power drivers and reliable receivers for high frequency operation of a large number of single-ended signals in existing technology for low cost VLSI digital systems.

SUMMARY AND OBJECTS OF THE INVENTION

A system of the present invention uses small swing differential source synchronous voltage and timing reference signals (SSVTR and /SSVTR) to compare single-ended signals of the same swing generated from the same integrated circuit for high frequency signaling. It will be appreciated that "/" is being used to indicate a logical NOT. All signals are terminated with their characteristic impedance on both ends of the transmission lines. SSVTR and /SSVTR toggle every time the valid signals are driven by the transmitting integrated circuit. Each signal receiver includes two comparators, one for comparing the signal against SSVTR and the other for comparing the signal against /SSVTR. A present signal binary value determines which comparator is coupled, optionally by using exclusive-OR logic with SSVTR and /SSVTR. Until SSVTR and /SSVTR have changed their binary value, the coupled comparator in the receiver detects whether a change in signal binary value occurred. Again, it will be appreciated that SSVTR and /SSVTR change their binary value every time the signal can change its binary value. SSVTR and /SSVTR are preferably synchronized with the signal.

The method of the present invention includes the steps of obtaining an oscillating source synchronous voltage and timing reference and its complement (SSVTR and /SSVTR), and receiving an incoming single-ended signal. The method compares the oscillating reference against the incoming signal by a first comparator to generate a first result, and compares the complement against the incoming signal by a second comparator to generate a second result. The method then selects one of the first result or the second result as an output signal based on the previous signal. The step of selecting one of the results includes comparing the output signal to the reference (SSVTR) and to the complement (/SSVTR). The step of selecting further includes manipulating the output signal from the previous signal towards the first result or second result, based on the comparator which is currently coupled. If the incoming signal changes, the step of selecting includes maintaining the same comparator coupled. If the incoming signal stays the same, the step of selecting includes de-coupling the currently coupled comparator and coupling the other comparator. The method then allows the circuit to stabilize.

The system and method advantageously eliminate the need for a high impedance VREF signal for comparison of small swing single-ended signals. This reduces the need for three distinct voltage levels (the output high level, output low level and the VREF level) to two distinct voltage levels (the output high level and the output low level). Eliminating VREF reduces necessary voltage swing and accordingly reduces power consumption. Using a receiver with dual comparators allows coupling of the receiver to the same comparator when the signal changes every cycle. Only one comparator is coupled based on the current binary value of the signal and SSVTR. The system has an individually adjustable delay for each receiver to couple or de-couple the comparator, thereby reducing the effect of skew during transmission of source synchronous signals. The system may have multiple differential source synchronous voltage and timing reference signals to compare multiple single-ended signals in the same integrated circuit such as a microprocessor or system controller that has many signals. The system and method provide differential signaling benefits in a single-ended signaling system.

Using the same concept, the system may have bi-directional complementary source synchronous voltage and timing reference signals to compare bi-directional single-ended signals. The system may have a driver or transmitter for controlling the signal slew rate to be a substantial portion the total signal period, thereby reducing output current. The system may have internal impedance matching circuitry such as pull-up resistors or grounded gate p-channel for matching the characteristic impedance of the transmission line on both ends of a point-to-point connection between CPU and cache or CPU and system controller. The system has a dual comparator circuit to convert a single-ended bus with two complimentary signals to be transmitted and received with comparable noise immunity of differential bus for internal data bus of memory, processor or other wide data bus type integrated circuits. The system preferably has variable device size of the transmitter with slow turning-on and slow turning-off to have similar slew rates for all signals in each group of SSVTR and /SSVTR and plurality of signals which are transmitted together. Further, it will be appreciated that the control signals and address signals may be transmitted on a different channel than the data signals. This enables running the control and address channel at a different frequency than the data channel, and enables different loads to be applied to each of the channels.

BRIEF DESCRIPTION OF THE DRAWINGS

FIG. 3A is a timing diagram illustrating the differential reference signals SSVTR and /SSVTR relative to signal sense times.

FIG. 7A is a schematic diagram illustrating a FIG. 4 single-ended signal receiver in a first embodiment.

FIG. 10 illustrates signal waveforms and skew between them.

FIG. 15A illustrates a differential amplifier that amplifies the difference between a data signal and a reference.

FIG. 17 is a timing diagram illustrating signal transition time in an application requiring fast bus turnaround from read to write or vice versa.

DETAILED DESCRIPTION OF THE PREFERRED EMBODIMENT

The present invention provides a signaling system and method for high-speed communication on multiplexed buses or point-to-point connections between multiple VLSI devices and provides lower power consumption relative to current methodology of interfacing single-ended signals. The signaling system can be used to connect multiple memory devices with a multiplexed bus to a memory controller for block transfer of data, addresses and control information. By using multiple buses, devices such as DRAMs, cross-point switches, processors, wide SRAMs and System controllers can be put together to achieve bandwidths above four gigabytes/sec. Virtually all of the signals needed for computer or other digital systems can be sent over this bus. Persons skilled in the art will recognize that all devices like CPUs in the computer system need the methodologies and bus structures of this system.

Figure 1A:
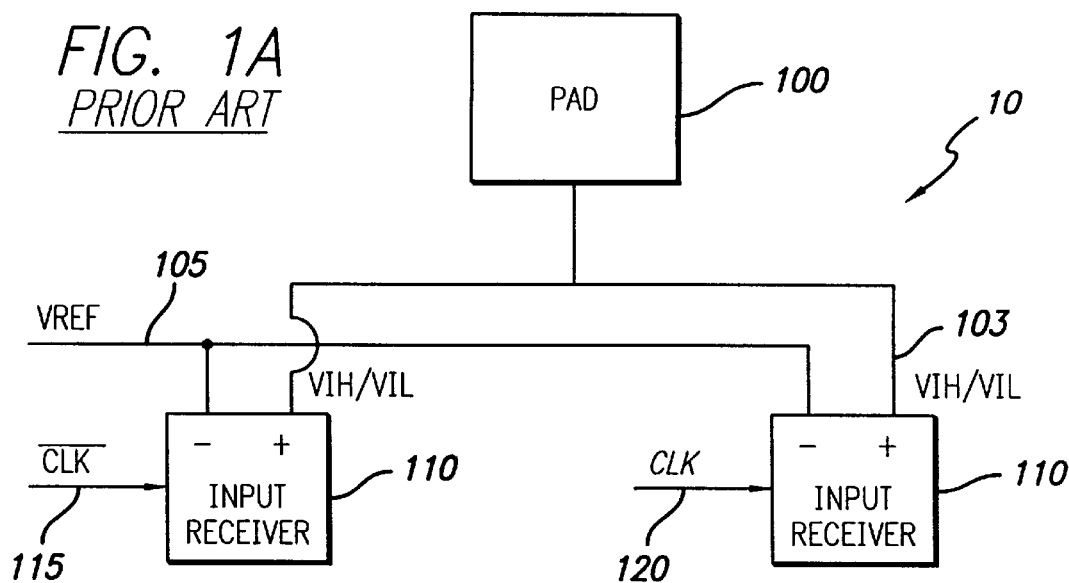
FIG. 1A is a block diagram illustrating a prior art RAMBUS-based receiver.
Figure 1B:
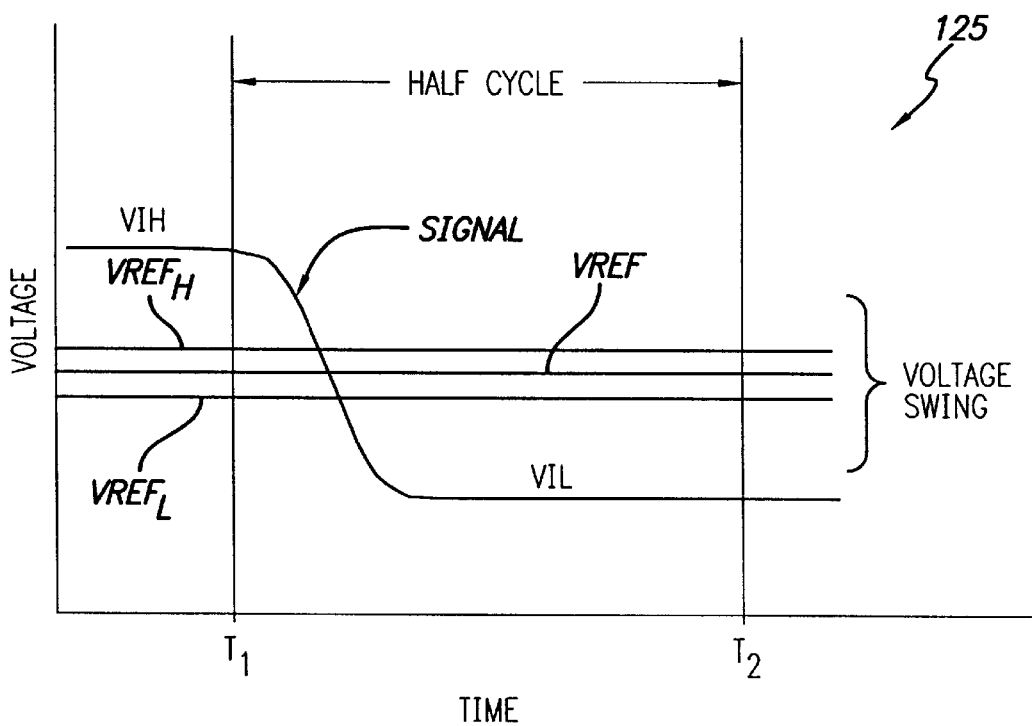
FIG. 1B is a timing diagram illustrating signal levels of the FIG. 1A prior art receiver.
Figure 1C:
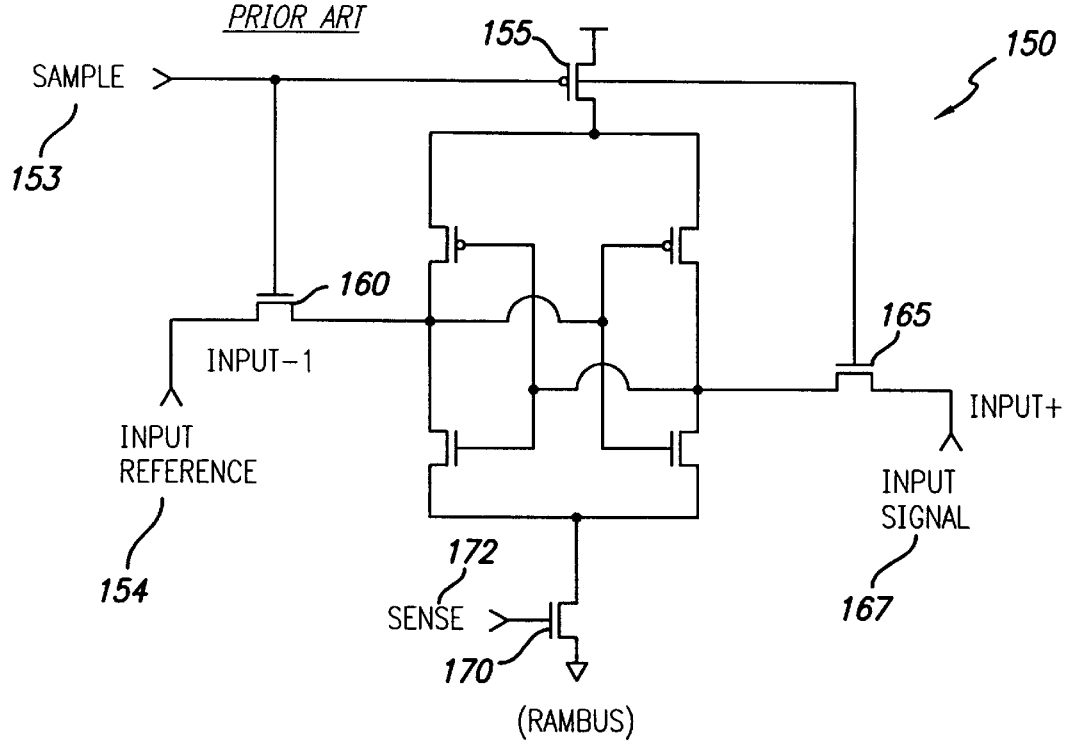
FIG. 1C is a schematic diagram illustrating another prior art RAMBUS-based receiver.
Figure 1D:
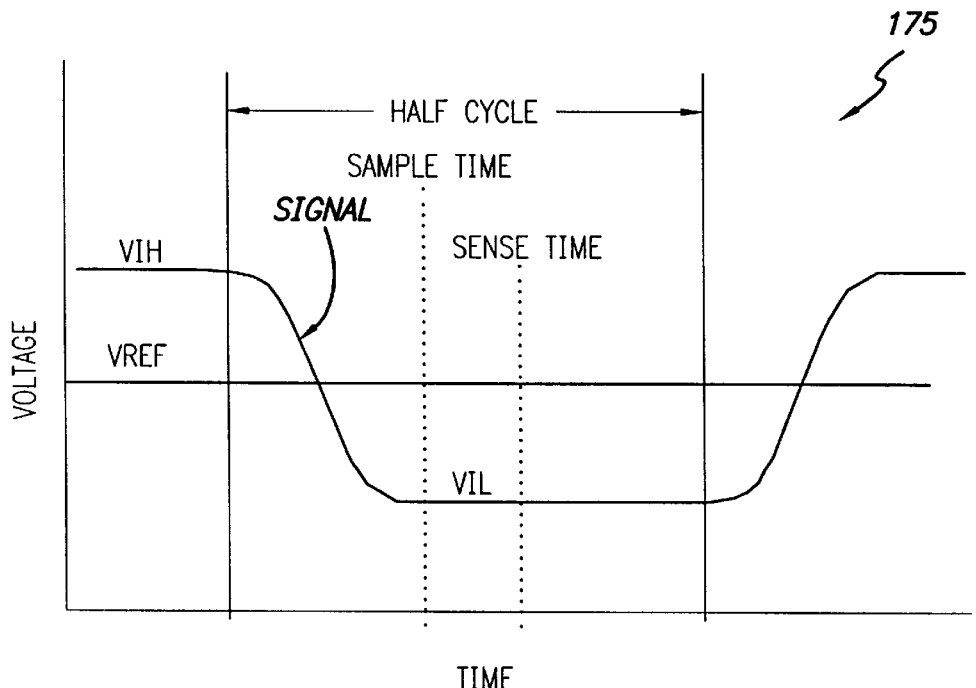
FIG. 1D is a timing diagram illustrating operation of the FIG. 1C prior art receiver.
Figure 2A:
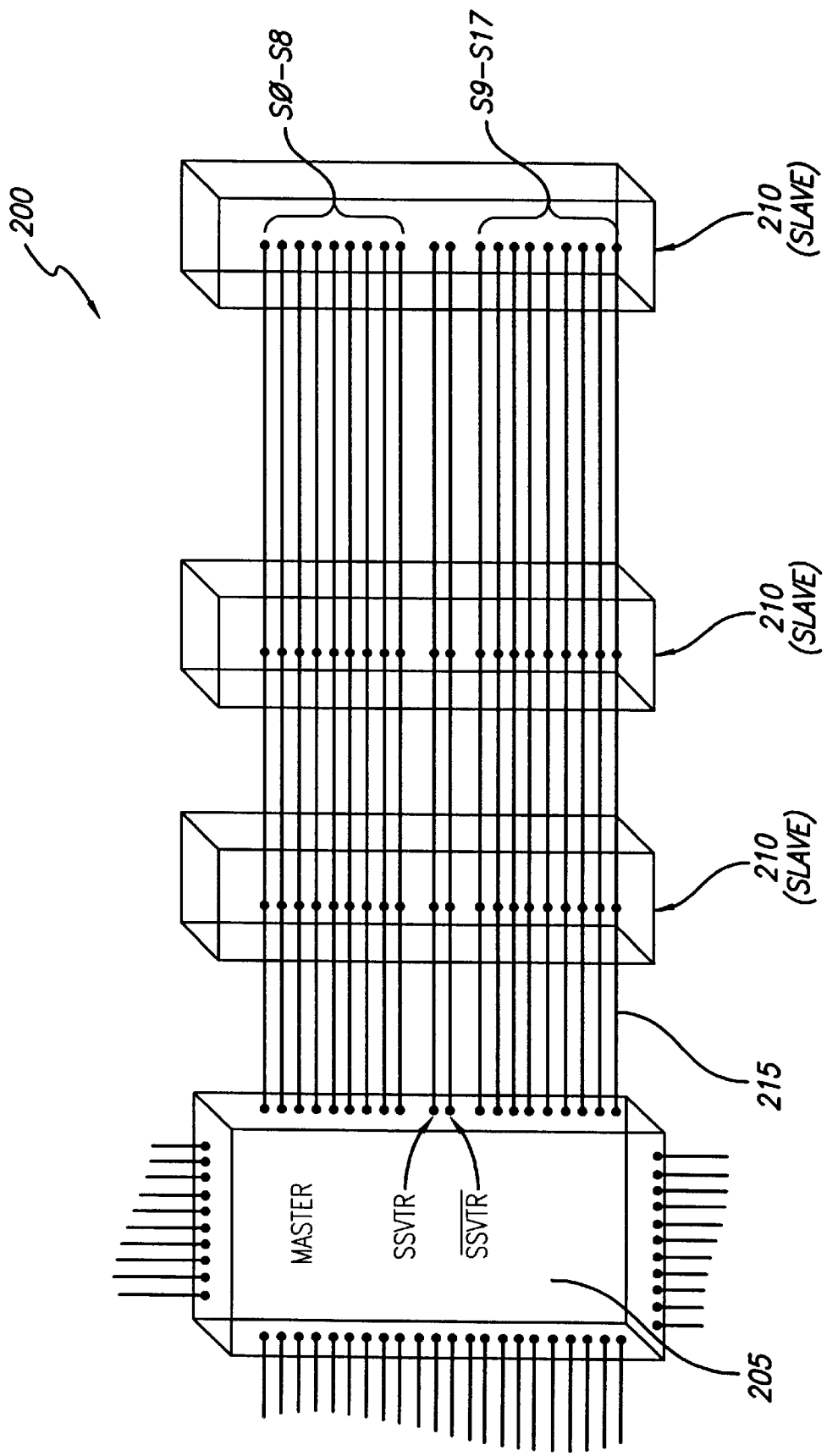
FIG. 2A is a perspective view block diagram illustrating a system with a master and slave devices in accordance with the present invention.

FIG. 2A is a perspective view block diagram illustrating a system 200 with a master device (transmitters) 205 coupled via a bus architecture (transmission lines) 215 to multiple slave devices (receivers) 210 in accordance with the present invention. As illustrated, the master 205 is configured to communicate, for example, twenty (20) signals including single-ended signals S0 to S17, small swing complementary source synchronous voltage and timing references SSVTR and /SSVTR, power lines (not shown) and ground lines (not shown) in parallel via transmission lines 215 to each slave 210. It will be appreciated that "/" is being used to indicate a logical NOT. The signals S0–S17 can be data, control or addresses either multiplexed or non-multiplexed as defined by the protocol. There may be additional signals like clock or initialization for other purposes required by the protocol or synchronization of system.

As shown in FIG. 3A, the SSVTR and /SSVTR signals toggle every time the valid signals are driven by the master 205. It will be appreciated that slave 210 may include multiple receivers (405, FIG. 4), wherein each receiver 405 includes two comparators, one for comparing the signal against SSVTR and the other for comparing the signal against /SSVTR. A present signal binary value determines which comparator is coupled to the output terminal 420, optionally by using exclusive-OR logic with SSVTR and /SSVTR. Until SSVTR and /SSVTR have changed their binary value, the enabled comparator in the receiver 405 detects whether change in signal binary value occurred.

Figure 19:
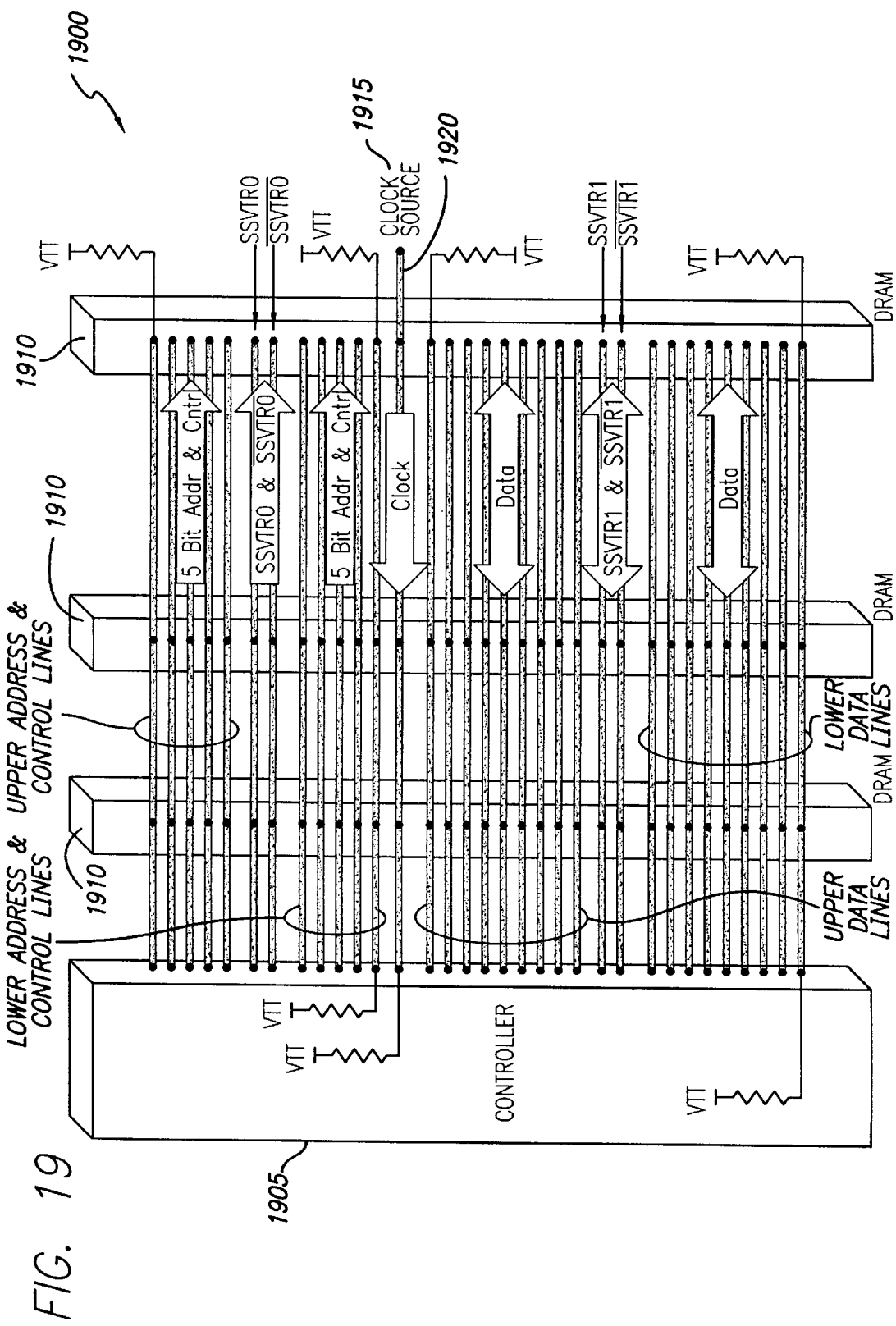
FIG. 19 shows a system having multiple buses, where signals are received simultaneously.
Figure 20:
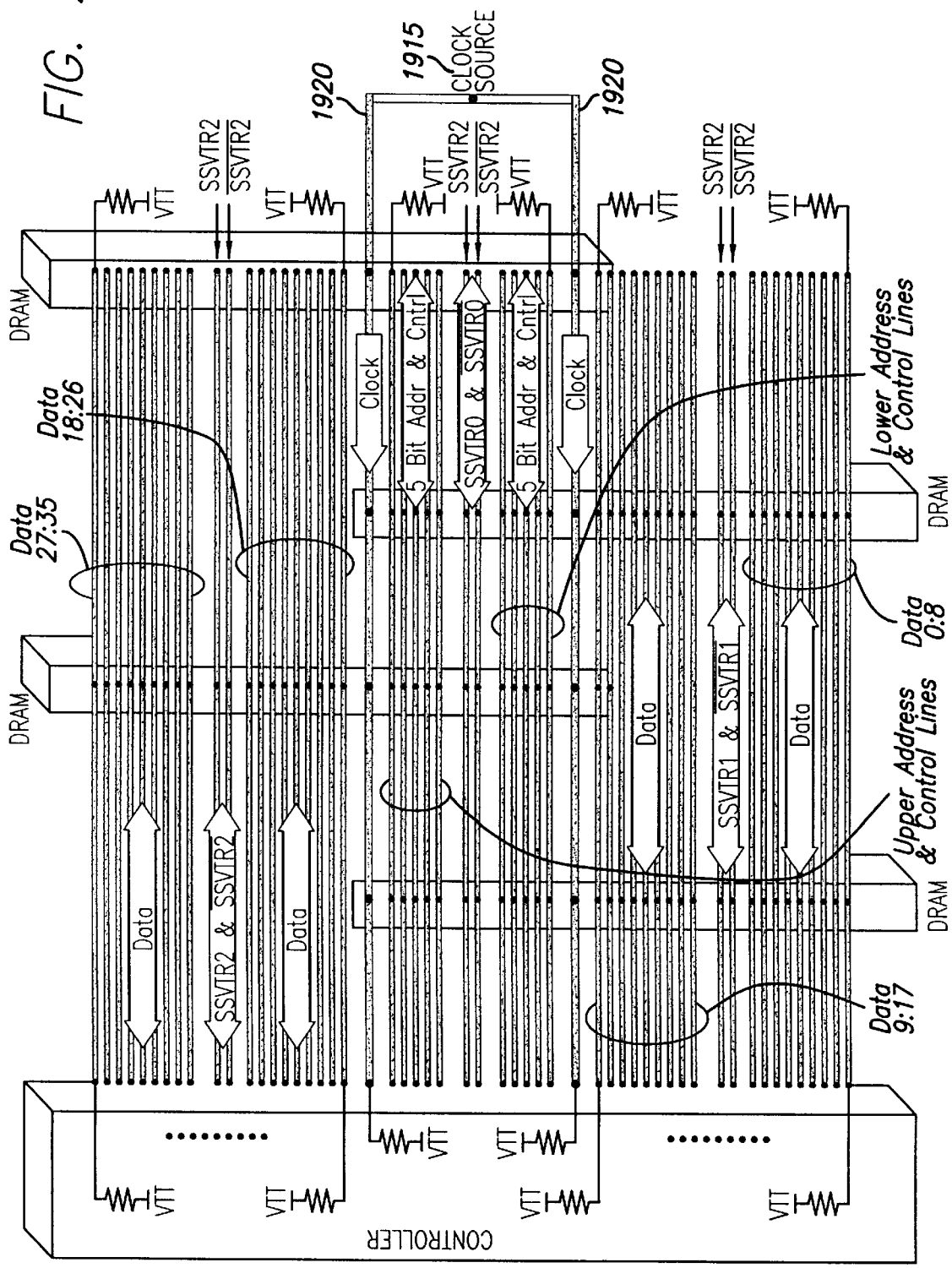
FIG. 20 is a block diagram illustrating a system having three buses for achieving higher bandwidth.
Figure 21:
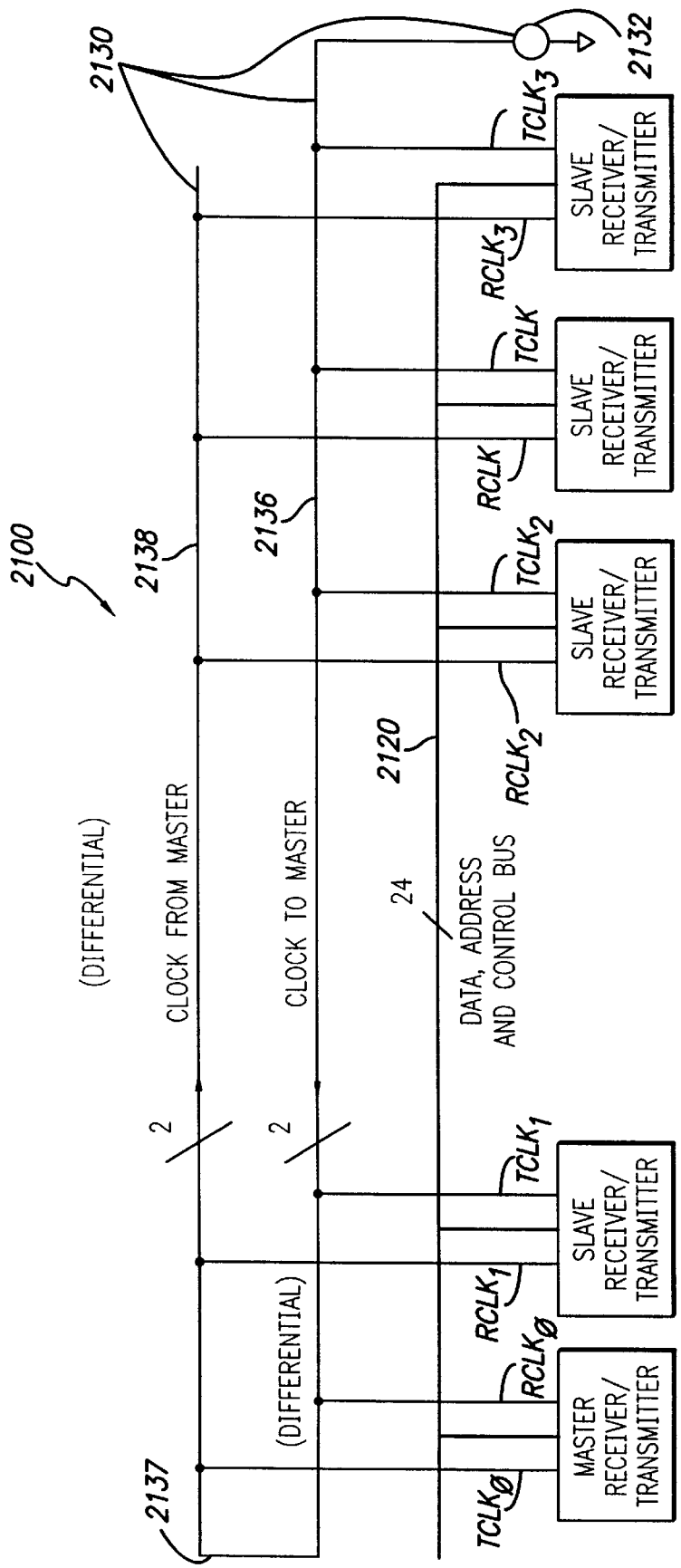
FIG. 21 illustrates a prior art system for DRDRAM, which uses a clock line having two segments.

For chip-to-chip communication on a bus or point to point, all signals are transmitted preferably at substantially the same time from the same chip to another chip or plurality of chips connected on the bus and preferably have substantially the same loading, swing and slew rate (when the signals are transitioning). Also, for intra-chip communication, the signals are driven preferably at substantially the same time from the same area or block to other areas or other blocks in the same chip and preferably have substantially the same loading, swing and slew rate (when the signals are transitioning). FIGS. 19 and 20, described below, illustrate a system and method for assuring that the signal are driven at substantially the same time.

To facilitate extremely high data transmission rates over this external bus, the bus cycles are initiated when SSVTR is low (i.e., /SSVTR is high). All block transfer begins during the cycle when SSVTR is low and ends with SSVTR going low to ease presetting the receiver 405 for the last binary value of the signal. This allows burst transfers of even number of bits. When the signals need to change direction (due to the multiplex nature of signals), one or more dead cycles may be required for settling down the bus due to propagation delays or settling of SSVTR and /SSVTR, when they are bi-directional. FIG. 17, described below, illustrates bi-directional timing for bus turn around to avoid lost dead cycles.

Figure 2B:
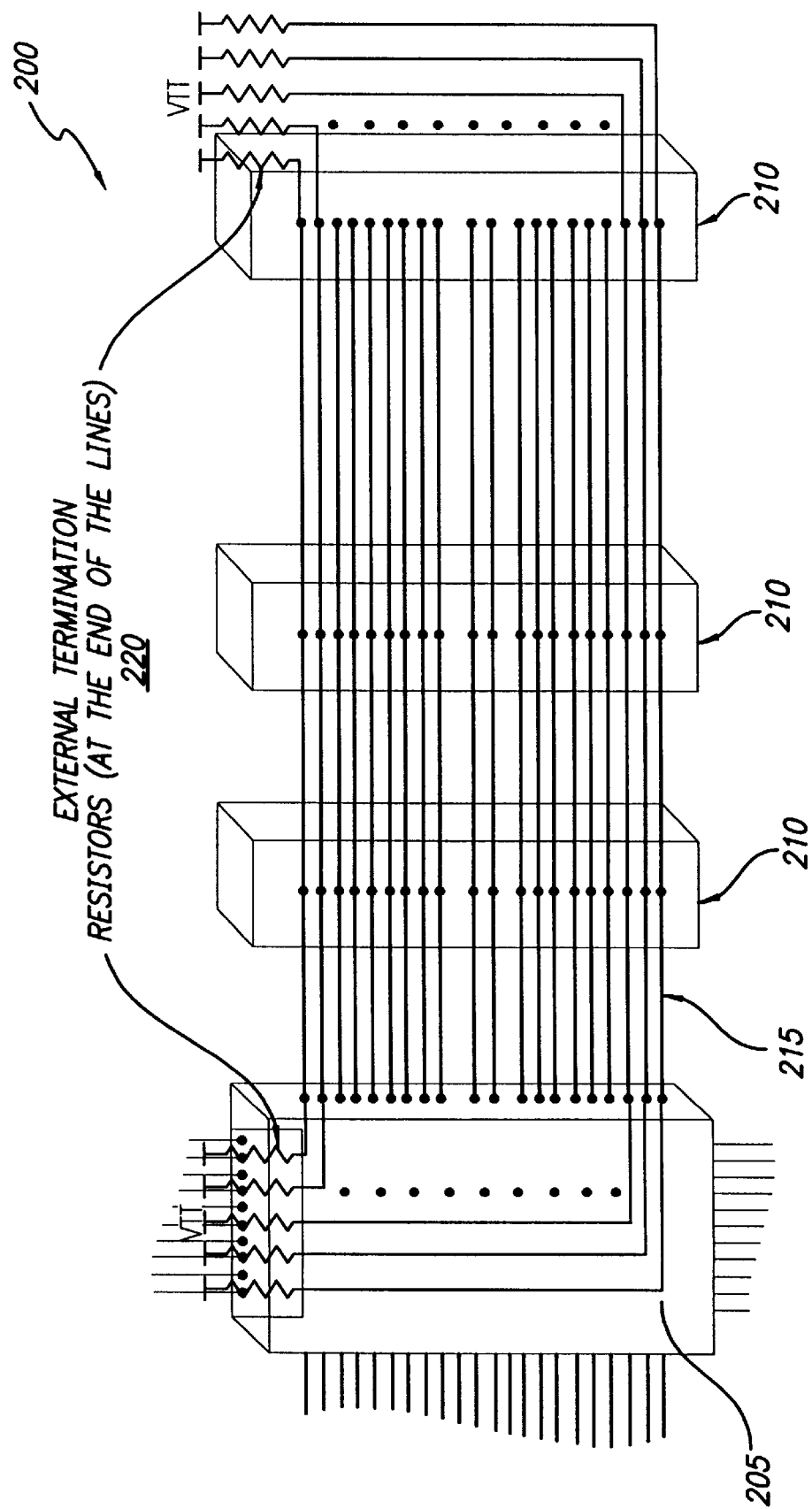
FIG. 2B is a block diagram illustrating the FIG. 2A system having transmission lines with impedance matching resistors at the ends.

FIG. 2B is a block diagram illustrating the system 200 (FIG. 2A) having transmission lines 215 with external impedance matching resistors 220 having termination resistance equal to their characteristic impedance, which is preferably between 50–70 ohms, at the ends. The termination voltage is labeled VTT, which is preferably around 1.8 v for a 2.5 v operating voltage (for VCC of 2.5V and VSS of 0V). The nominal voltage swing is preferably set less than one volt, preferably less than 40% of the supply voltage, and most preferably set at 500 mv. Therefore, as shown in FIG. 3A, the output high voltage (VOH) is 1.8 v and output low voltage (VOL) is 1.3 v.

FIG. 3A is a timing diagram illustrating the complementary reference signals SSVTR and /SSVTR relative to signal sense times. SSVTR initiates at VOL and /SSVTR initiates at VOH. In the first cycle, the master 205 drives all the low going signals including /SSVTR to VOL at the same time and the termination resistances 220 pull up SSVTR to VOH. The single-ended signals that are high are held at VOH by the terminating resistances. Proper sense time, i.e., time to sense the logic level of an input signal, is after the transition junction of SSVTR and /SSVTR and before the stable time, i.e., when the SSVTR or /SSVTR reaches steady state at VIH or at VIL. The SSVTR and /SSVTR preferably have equal rise and fall times, wherein each rise and fall time is approximately half of a cycle time of either reference.

Figure 3B:
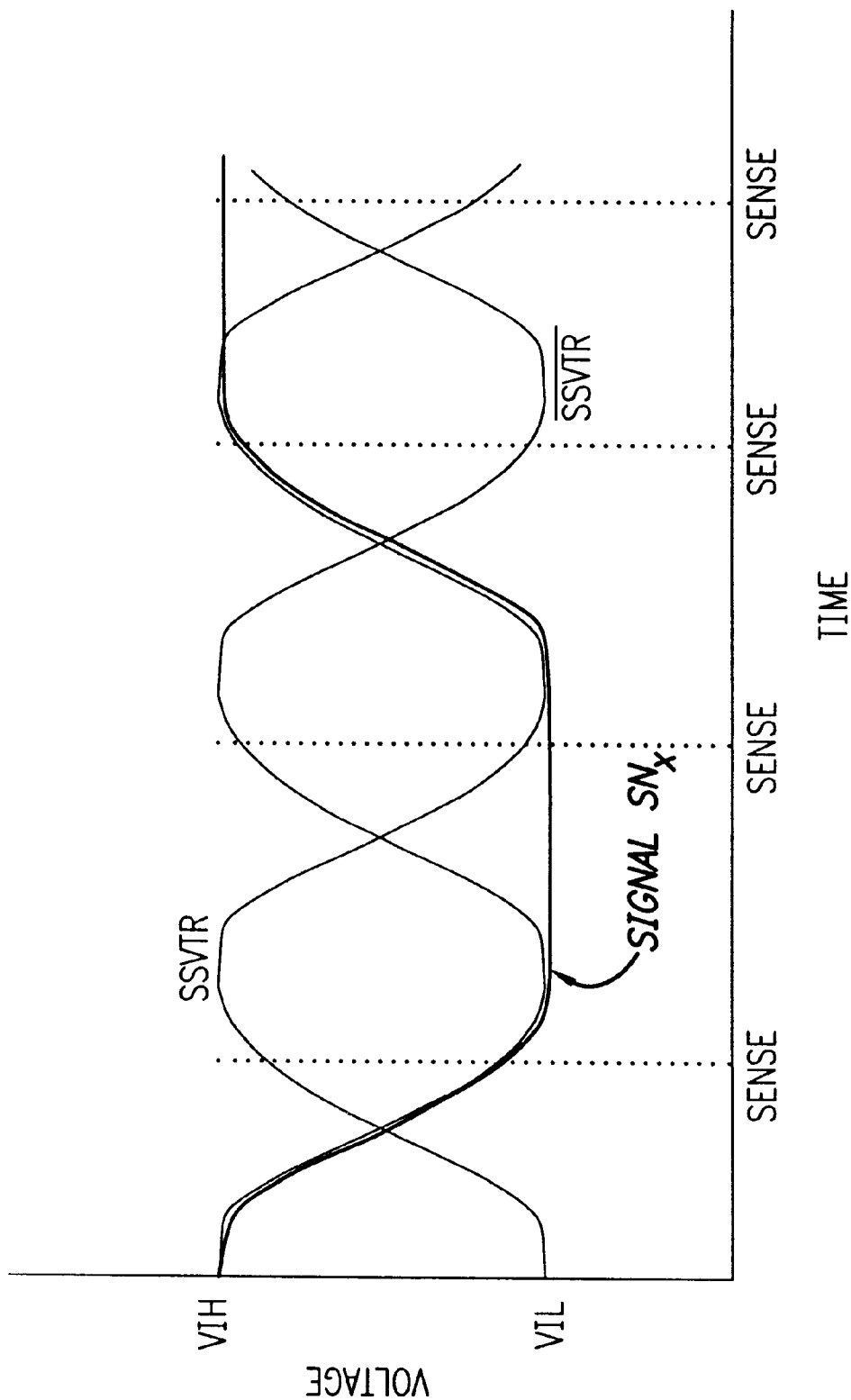
FIG. 3B is a timing diagram illustrating SSVTR and /SSVTR relative to a single-ended signal.

FIG. 3B is a timing diagram illustrating SSVTR and /SSVTR relative to a single-ended signal. The single-ended signal begins equal to /SSVTR at a high voltage, and then transitions with /SSVTR to a low voltage. The single-ended signal then remains at a low voltage, thereby becoming equal to SSVTR, and then transitions with SSVTR to a high voltage. The single-ended signal then remains at a high voltage, thereby becoming equal to /SSVTR.

Figures 1, 4:
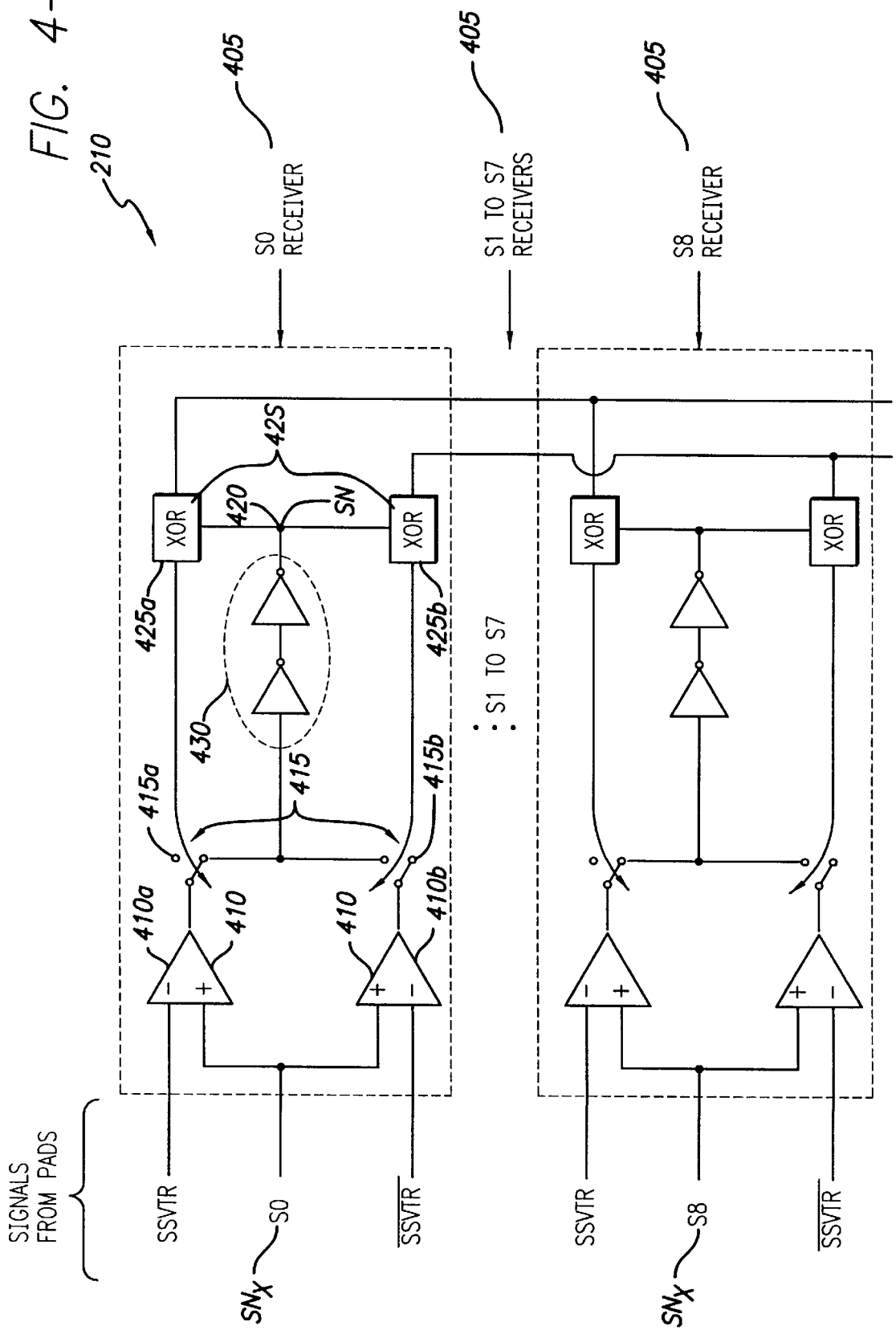
FIG. 4 is a high level schematic illustrating single-ended signal receivers.

FIG. 4 is a high level schematic illustrating a single-ended signal slave 210, having a receiver 405 for each signal line 215. Each signal receiver 405 has two comparators 410, one comparator 410a for comparing an incoming single-ended signal "SNx" to SSVTR and the other comparator 410b for comparing SNx to /SSVTR. Both of the comparators 410 have output terminals selectively coupled via switches 415 to an output terminal 420. It will be appreciated that the output signal (SN) to the output terminal 420 is preferably a full rail signal (0V to 2.5V).

As stated above, SSVTR is initially set to VOL and /SSVTR and SNx are initially set tho VOH. SN is initially set to a full rail high output voltage. Accordingly, the comparator 410a amplifies high voltage SNx minus low voltage SSVTR, thereby providing a high output signal. The comparator 410b amplifies high voltage SNx minus high voltage /SSVTR, providing a noise-amplified unknown output signal. Switch 415 selection is controlled by exclusive-OR (XOR) logic gates 425. More particularly, XOR gate 425a compares a full rail SSVTR amplified signal (VT) against output signal SN, and generates a control signal for controlling switch 415a. XOR gate 425b compares full rail /SSVTR (/VT) against output signal SN, and generates a control signal for controlling switch 415b. In this initial state, only SSVTR and accordingly VT are low, thereby causing XOR 425a to drive switch 415a closed. Accordingly, the comparator 410a output (high) reaches output terminal 420. XOR 425 drives switch 415b open, thereby preventing the entry of the unwanted output signal from comparator 410b. Receiver 405 is stable.

Following the example illustrated in FIG. 3B, the single-ended signal SNx transitions to a low voltage. As always, SSVTR and /SSVTR transition opposite to one another. Accordingly, as soon as SSVTR and /SSVTR achieve a predetermined difference (preferably 250 mV) therebetween, VT and /VT transition. Similarly, as soon as SSVTR and SNx transition to a predetermined difference (preferably 250 mV) therebetween, the output of comparator 410a also transitions (to a low output voltage). It will be appreciated that the path from external signal SNx to the generation of output signal SN and the path for full rail signal VT and /VT generation path each include one comparator 410 or 435 and two inverters 430 or 440. Thus, each XOR 425 will receive new input signals based on the speed of the comparison by the comparators 410 and 435. In this example, as evident by the example timing diagram of FIG. 3B, SSVTR and /SSVTR will achieve a predetermined difference at the same time that SSVTR and SNx achieve the same predetermined difference. Accordingly, the XOR 425a will continue to receive differential inputs, thereby maintaining the same switch. 415a closed and enabling the low output voltage of comparator 410a to pass to output terminal 420. Receiver 405 is still stable.

Still following the example of FIG. 3B, the single-ended signal SNx does not transition. As always, SSVTR and /SSVTR transition relative to one another. Accordingly, currently enabled comparator 410a continues to drive a low output voltage. When SSVTR and /SSVTR achieve a predetermined difference relative to one another, but before SSVTR reaches the same voltage as SNx (thereby avoiding the possibility of an undetermined state of the output signal), the XOR 425a switches off and the XOR 425b switches on. It will be appreciated that, from the time /SSVTR began to rise, comparator 410b could drive a low output voltage. Receiver 405 is still stable.

Each receiver 405 can easily detect and amplify very small signals on the order of 100–250 mV. If the transition has occurred in the single-ended signal SNx, the output signal SN has the new level opposite to its previous signal level. Since both SSVTR (or /SSVTR) and single-ended signals have transitioned, the same comparator 410 is still coupled to the signal output terminal. If the single-ended signals SNx have not transitioned, then the signal output SN does not change, the comparator 410 coupled at the start of the transition is de-coupled from the output after the SSVTR and /SSVTR receiver has amplified their new binary state (VT & /VT), and the other comparator 410 which has opposite /SSVTR (or SSVTR) is coupled to provide the signal output. The old output level is thereby restored.

It will be appreciated that a receiver 405 may be implemented without using XORs. This may be implemented by using the known polarity of SSVTR and /SSVTR in the initial cycle and all single-ended signals starting high. The SSVTR and /SSVTR transition in every cycle. Thus, their polarity in every cycle may be determined by examining the system clock in a synchronous system and defining cycle start in even clock cycles (i.e., SSVTR is low in the even clock cycle and /SSVTR is high). Then, only the output signal "SN" is monitored to couple and de-couple the comparators 410 based upon whether output signal SN changes state every cycle or not. If output signal SN changes state, the coupled comparator is left alone. If the output signal SN does not change, the coupled comparator is de-coupled and the other comparator is coupled and so on.

It will be further appreciated that a system embodying the invention enables all signals to be connected to low impedance sources, enables all signals to present voltage and noise conditions virtually differential in noise immunity, and enables reduction of voltage swing compared to other single-ended signaling technologies like RAMBUS, HSTL or GTL. The small swing of 0.5 v implemented in this exemplary embodiment allows for very high signal rates with much lower power consumption as compared to other existing single-ended signaling technologies. Further, it will be appreciated that each receiver 405 amplifies the single-ended signals SNx during the transition of the signals without the need of a conventional clock or other timing signal except SSVTR, /SSVTR and their amplified versions VT and /VT.

Figures 2, 5:
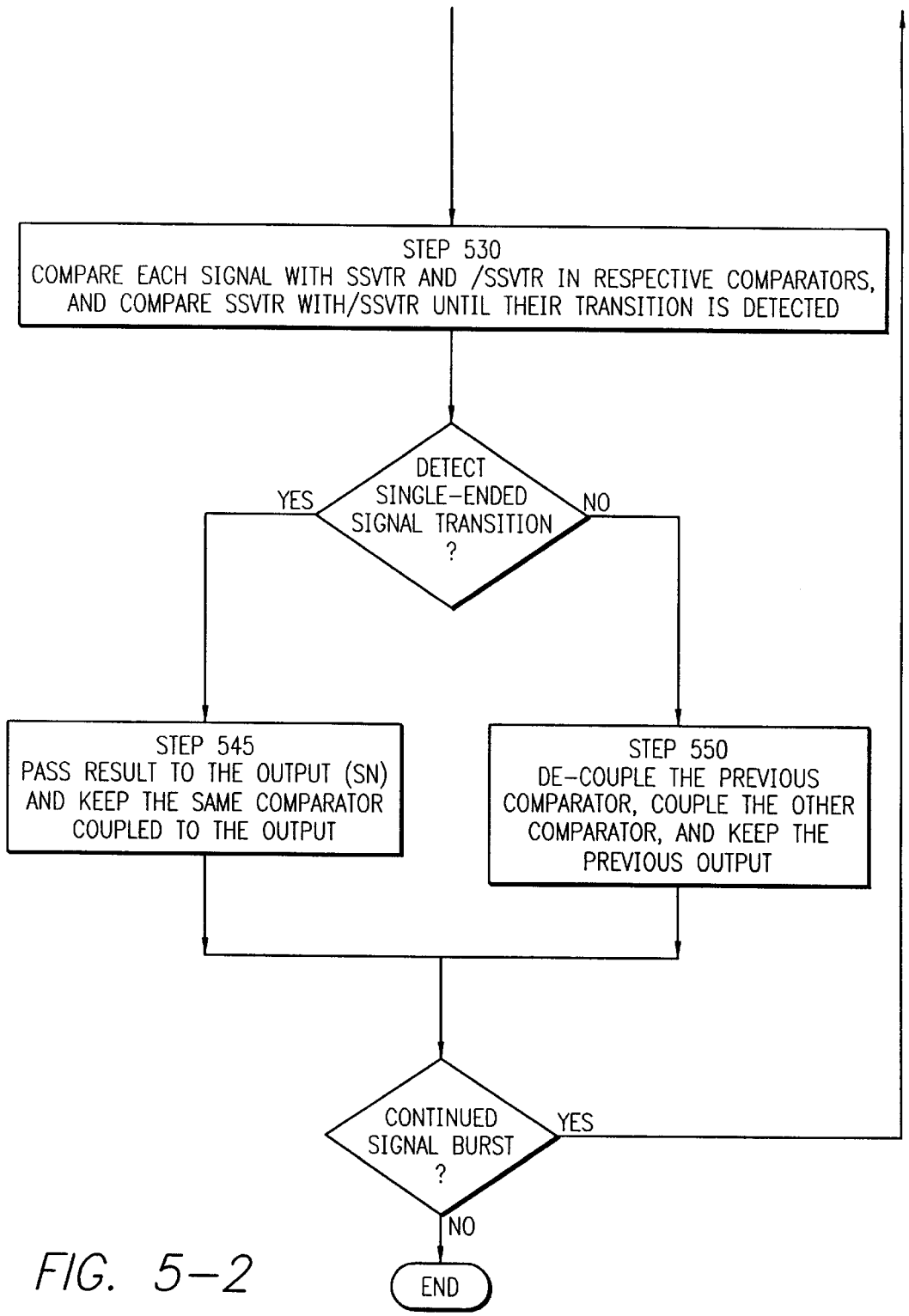
FIG. 5 is a flowchart illustrating a method of communicating signals from a transmitter across a transmission line to a receiver.

FIG. 5 is a flowchart illustrating a method 500 of communicating signals from a master 205 across a transmission line 215 to a receiver 405. Method 500 begins with the master 205 in step 505 setting SSVTR to VOL and all single-ended signals (/SSVTR and SNx) to VOH, and in step 510 setting all single-ended receiver outputs (SN) to a full rail high. The receiver 405 in step 515 couples the comparator 410a, which compares SSVTR against each single-ended signal SNx, to the output terminal 420 of the receiver 405. The receiver 405 in step 517 lets all signals on the transmission lines settle down. Steps 505–517 are referred to as system initialization.

The master 205 in step 520 simultaneously drives SSVTR and /SSVTR to their opposite states and all single-ended signals SNx to their desired levels. The receiver 405 in step 530 compares the single-ended signal SNx against SSVTR and /SSVTR in respective comparators 410. The receiver 405 in step 540 determines whether the single-ended signal transitioned. If so, then the receiver 405 in step 545 passes the result to the output terminal 420, and keeps the same comparator 410 coupled to the terminal 420. If not, then the receiver 405 in step 550 decouples the previous comparator 410, couples the other comparator 410 to the output terminal 420, and keeps the same output signal (SN). The transmitter 405 in step 555 determines whether the signal burst continues. If so, then method 500 returns to step 520. Otherwise, method 500 ends.

Figure 6A:
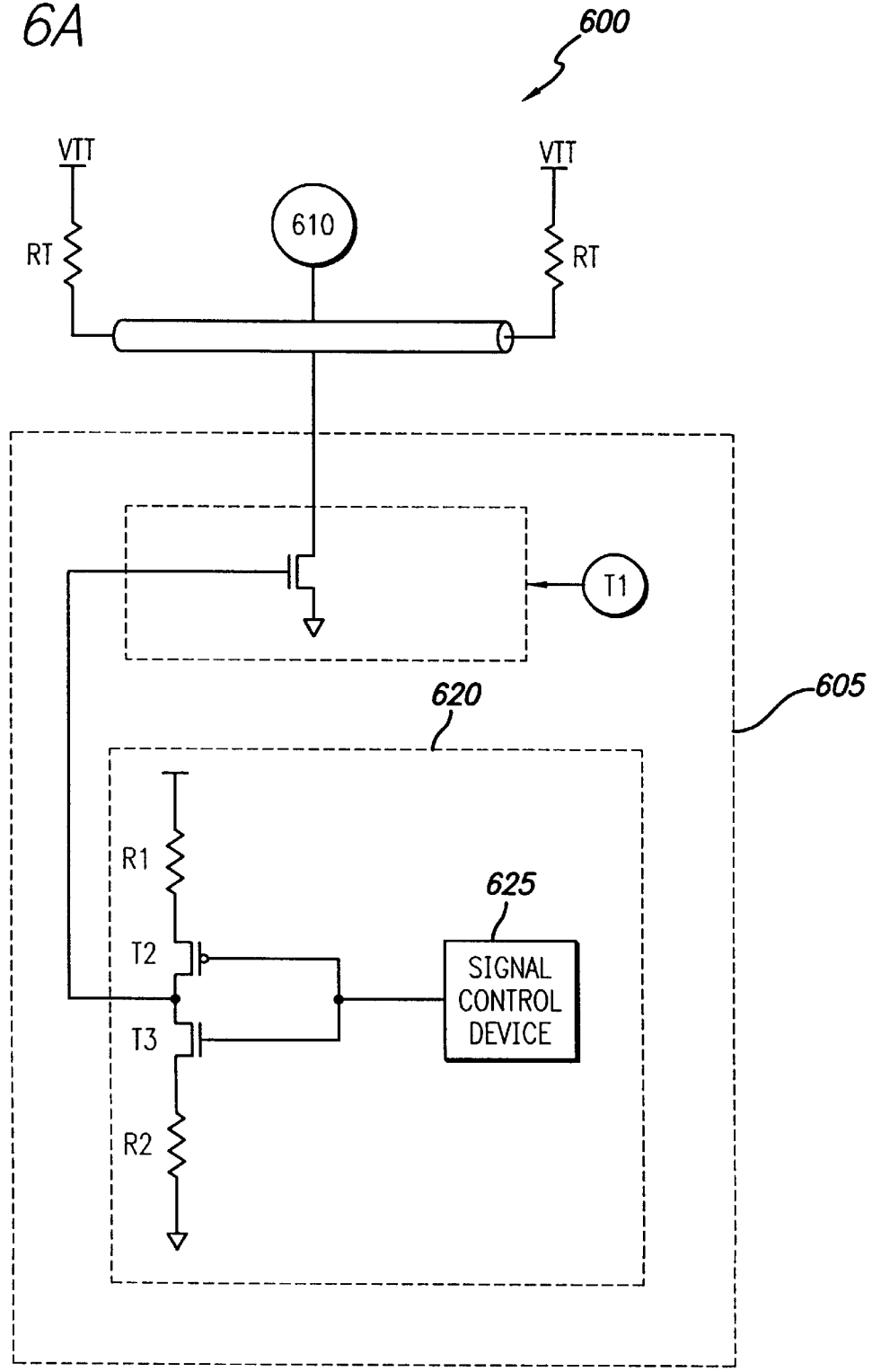
FIG. 6A is a schematic diagram illustrating a slow turning-on and slow turning-off driver for all signals.

FIG. 6A is a schematic diagram illustrating a slow turning-on and slow turning-off master 205 for a single-ended signal in a first embodiment referred to as transmitter 600. The transmitter 600 includes an NMOS pull down device 605 coupled to a transmission line 610 for accurately tailoring the output swing to 500 mv below VTT. The NMOS pull down device 605 includes a pull down NMOS transistor T1 having its source coupled to the transmission line 610, its drain coupled to ground, and its gate coupled to skew control circuitry 620. The skew control circuitry 620 includes a CMOS inverter, comprising two transistors T2 and T3, coupled between two resistors, R1 and R2. The input to the CMOS inverter is coupled to a signal control device 625. For example, to generate SSVTR or /SSVTR, the signal control device 625 may be an oscillator. It will be appreciated that the amount of pull down can be adjusted using a register (not shown) and a serial pin (not shown) during initialization to set the correct voltage swing for any process or device variations. Other methods like using feedback techniques to control is shown in Hans Schumacher, et al., "CMOS Subnanosecond True-ECL output buffer," J.Solid State Circuits, Vol, 25 (1), pp.150–154 (February 1990) may also be used. Maintaining the current at 20 ma and having parallel terminations of 50 ohms on both ends of the transmission line 610 (as controlled by R1 and R2) generates a 500 mv swing under all conditions. To have slow rise and fall times on the output and to minimize reflections, signal coupling and termination network switching noises, the skew control circuitry 665 controls the pull down transistor T1 to turn on and turn off slowly. The preferred slew rate is 1.6 ns/volt with transition times of 0.8 ns for 500 mv.

For a uniformly transitioning ramp-like signal, the preferred slew rate of signals is four times the sum of two inverter delays and an exclusive-OR delay in a given technology. In 0.25μ CMOS technology with an operating voltage of 2.5V, the inverter delay is 50 picoseconds and the exclusive-OR delay is approximately 120 picoseconds. Thus, the preferred slew rate is approximately 880 picoseconds. For signals transmitted above the rate of 600 MHz, the signal slew rate is preferably less than 110% of the signal rate. The preferred slew rate for exponential signals is slightly faster if the signal reaches 75% of its final value earlier than ¾ of the transition time. The differential signals preferably cross half way through the voltage transition. At around ¾ of the way through the voltage transition, the signals have a difference of about 250 mv which can be converted quickly to a large swing signal. To avoid noise amplification and to prevent signal coupling to the receiver output upon receipt non-transitioning single-ended signals, the transition time between 75% and the final signal value is preferably higher than the sum of two inverter delays and the exclusive-OR delay. It will be appreciated that the slew rate can go as fast as it takes amplified noise to reach the output of the comparator 410 whose output is coupled to the output terminal 420. That is, upon receiving a non-transitioning signal, the switches 415 switch state before the comparator output changes state based on noise amplification. The output of the currently coupled comparator 410 approaches an undetermined (noise amplified) state. The switches 415 must switch states before the undetermined output becomes available. It will be further appreciated that device mismatches, manufacturing tolerances and signal reflection will effect the speed at which the output of the comparator 410 reaches the undetermined state. As the technology improves, gate delays, faster slew rates and faster signal rates will be achievable.

Figure 6B:
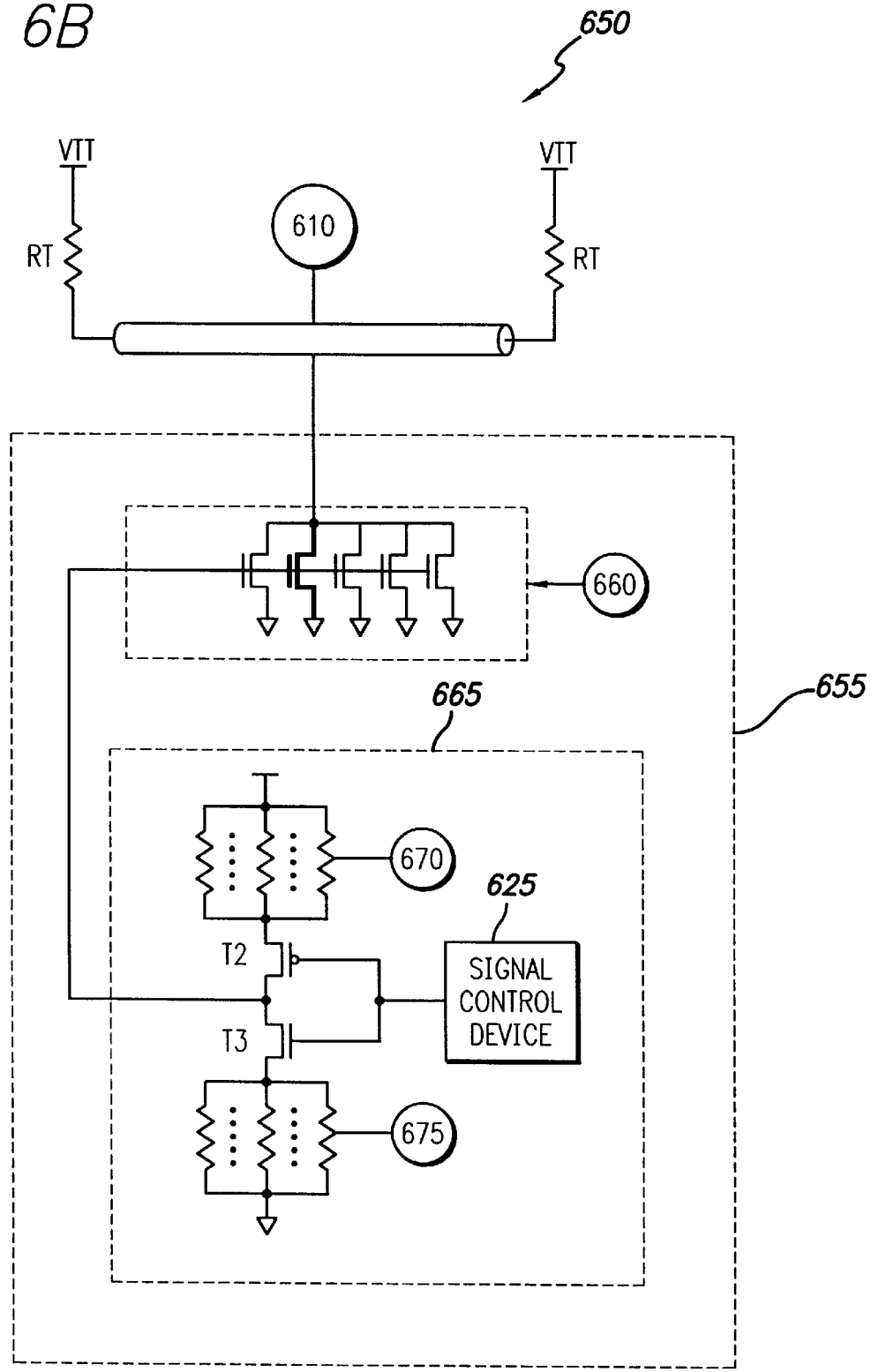
FIG. 6B is a schematic diagram illustrating drivers having adjustable signal slew rates and skew between signals.

FIG. 6B is a schematic diagram illustrating master 205 having adjustable signal slew rates and skew between signals, in another exemplary embodiment referred to as transmitter 650. Transmitter 650 includes an NMOS pull down device 655 coupled to the transmission line 610 for accurately tailoring the output swing to 500 mv below VTT. The NMOS pull down device 655 includes a pull down NMOS transistors 660 connected in parallel, each having its source coupled to the transmission line 610, its drain coupled to ground, and its gate coupled to skew control circuitry 665. The skew control circuitry 665 includes a CMOS inverter, comprising two transistors T2 and T3, coupled between two sets 670 and 675 of parallel-connected resistors. The input to the CMOS inverter is coupled to the signal control device 625. The resistor sets 670 and 675 tune the rise and fall times. It will be appreciated that the rise and fall times are preferably as symmetric as possible to have midpoint crossover of all signals and sensing of all signals by the differential receivers to occur simultaneously. Achieving symmetry and setting the slew rate and output swing can be achieved during the testing phase by blowing fuses (not shown) or during initialization on board by setting a register (not shown).

It will be appreciated that the signal transition times may be slightly higher than the signal rate. In some heavily loaded buses, the swing can be increased to take care of transmission losses, still presenting 500 mv for the receiver 210 to sense easily. It will be further appreciated that various slew rates, exponential transition times and voltage swings are possible based on technology, loading, and receiver acquisition and resolution delays. Even transition times slightly higher than signal rate are possible with transitioning signals reaching 90 to 95% percent of their final value, while bursting. Also during testing the skew between single-ended signals and SSVTR and /SSVTR is adjusted using NMOS pull down size and resistors in the gate prior to it, using well known techniques like laser fuse blowing or setting the register code to achieve the signal waveform shape as shown in FIG. 10. As shown in FIG. 10, all single-ended signals SNx should be coincident or less than 50 psec ahead of the SSVTR and /SSVTR transition. This skew may be adjusted after testing to be in this range.

Figure 7B:
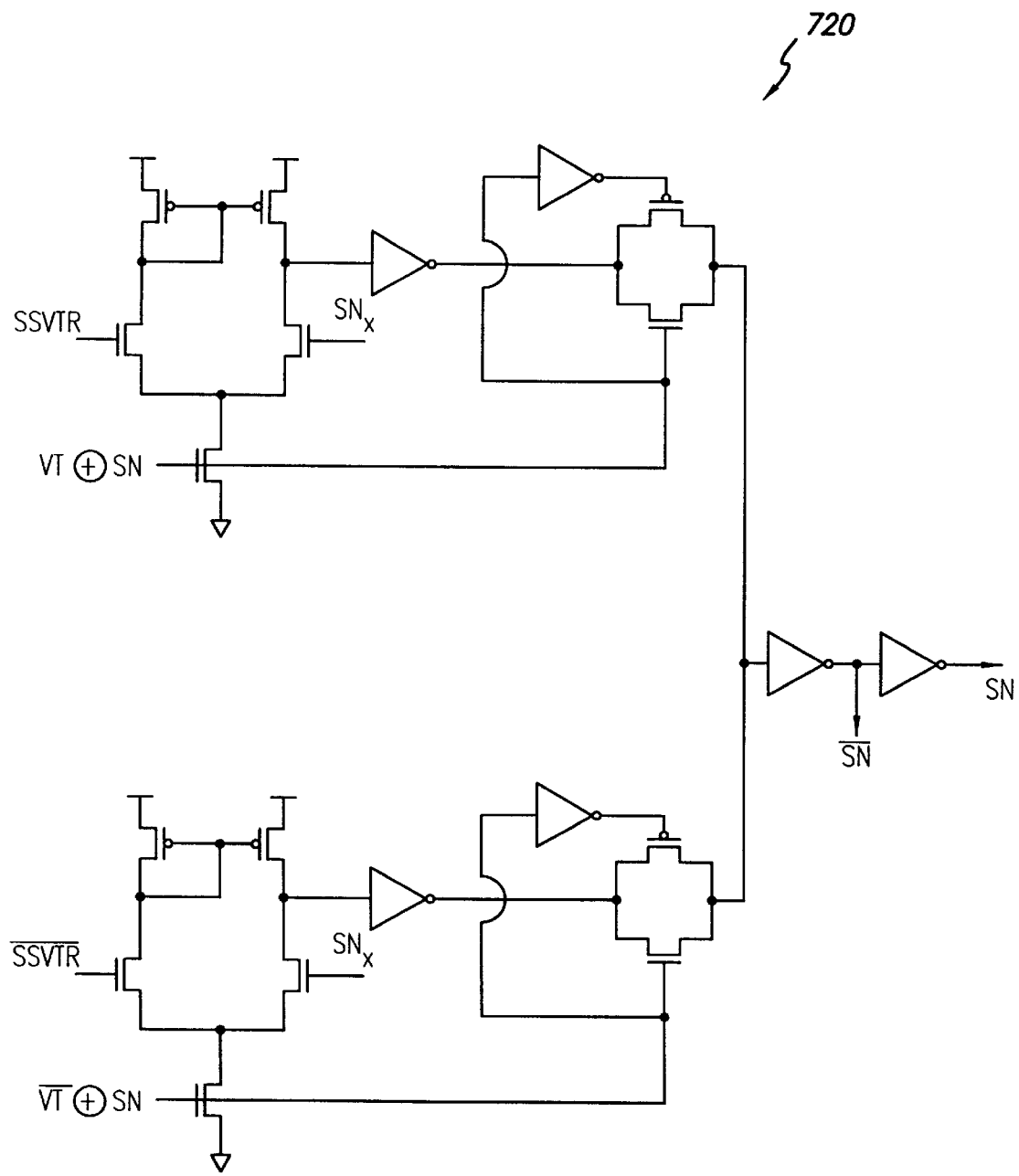
FIG. 7B is a schematic diagram illustrating a FIG. 4 single-ended signal receiver in a second embodiment.

FIGS. 7A–7D illustrate alternative embodiments of each signal receiver 405 of FIG. 4. It will be appreciated that the comparators 410 of receiver 405 need to operate during every cycle, requiring small acquisition and resolution delays, taking no input current and injecting no current back into signal lines. The common differential amplifier satisfies all these requirements. Referring to FIG. 7A, the receiver 210 uses dual differential amplifiers 702, one differential amplifier 702a for comparing the signal SNx to SSVTR and the other differential amplifier 702b for comparing the signal SNx to /SSVTR. For completeness, a brief review of differential amplifiers 702 is provided. The differential amplifier 702 is always enabled. Based on channel sizes, when the SSVTR voltage is higher than the SNx voltage, more current is driven across the PMOS transistor T10, thereby pulling the output voltage at node 707 high (close to VCC or 2.5V). When the SSVTR voltage is less than the SNx voltage, more current is drawn across the NMOS transistor T11, thereby pulling the output voltage at node 707 low (close to VSS or 0V). The differential amplifier converts 0.5V (small swing) input to a large swing (0V to 2.5V) output.

The outputs of the differential amplifiers are amplified and inverted by an inverter 704, pass through CMOS transmission gates 706 and are tied together at node 708. The transmission gates 706 are selectively operated depending on the amplified state of previous signal (SN) exclusively-ORed with an amplified state of SSVTR or /SSVTR, i.e. VT or /VT respectively. The exclusive-OR is designed to be stable without glitches for small timing variations between SN, VT and /VT reaching their respective logic levels.

Figure 7C:
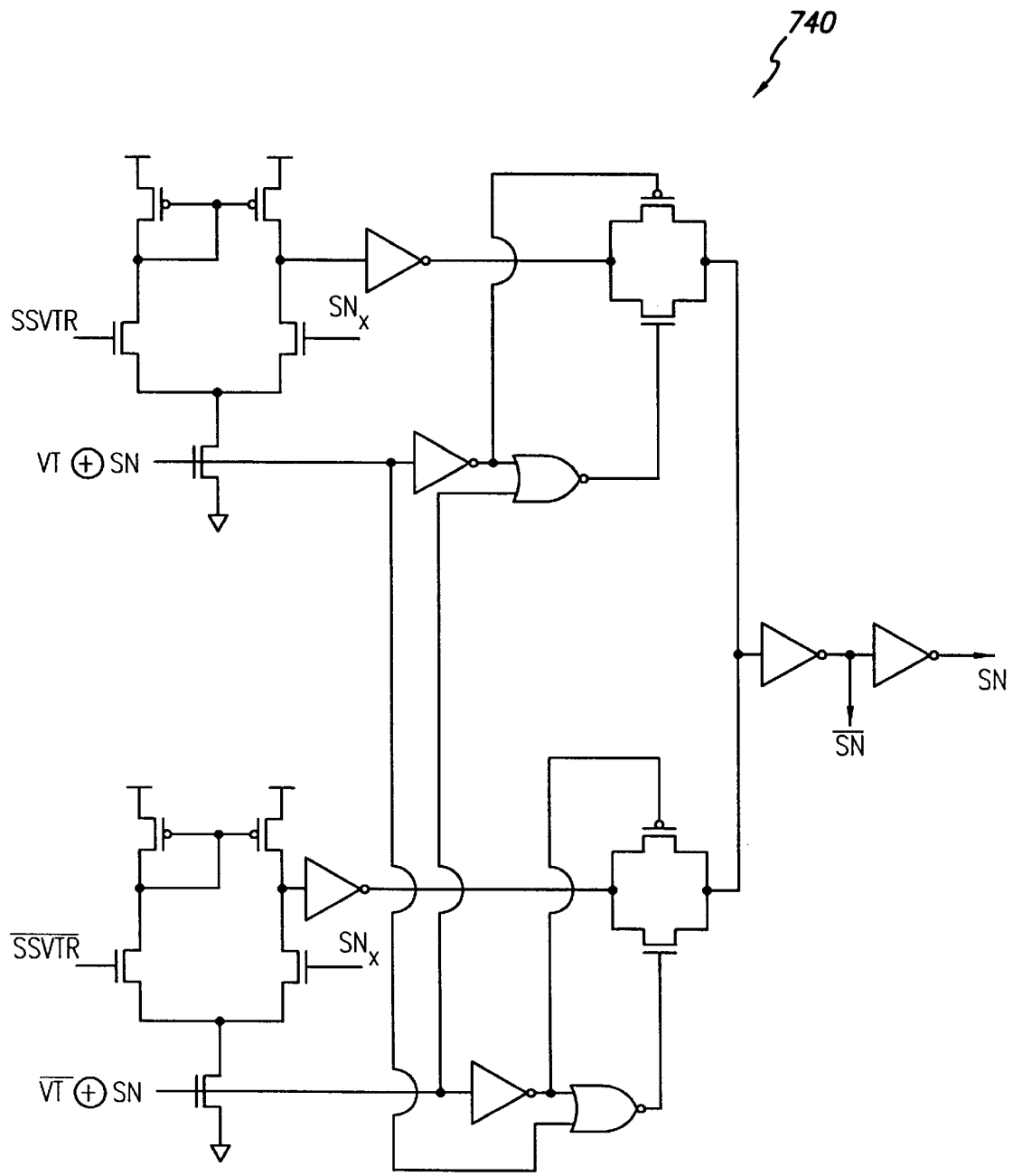
FIG. 7C is a schematic diagram illustrating a FIG. 4 single-ended signal receiver in a third embodiment.
Figure 7D:
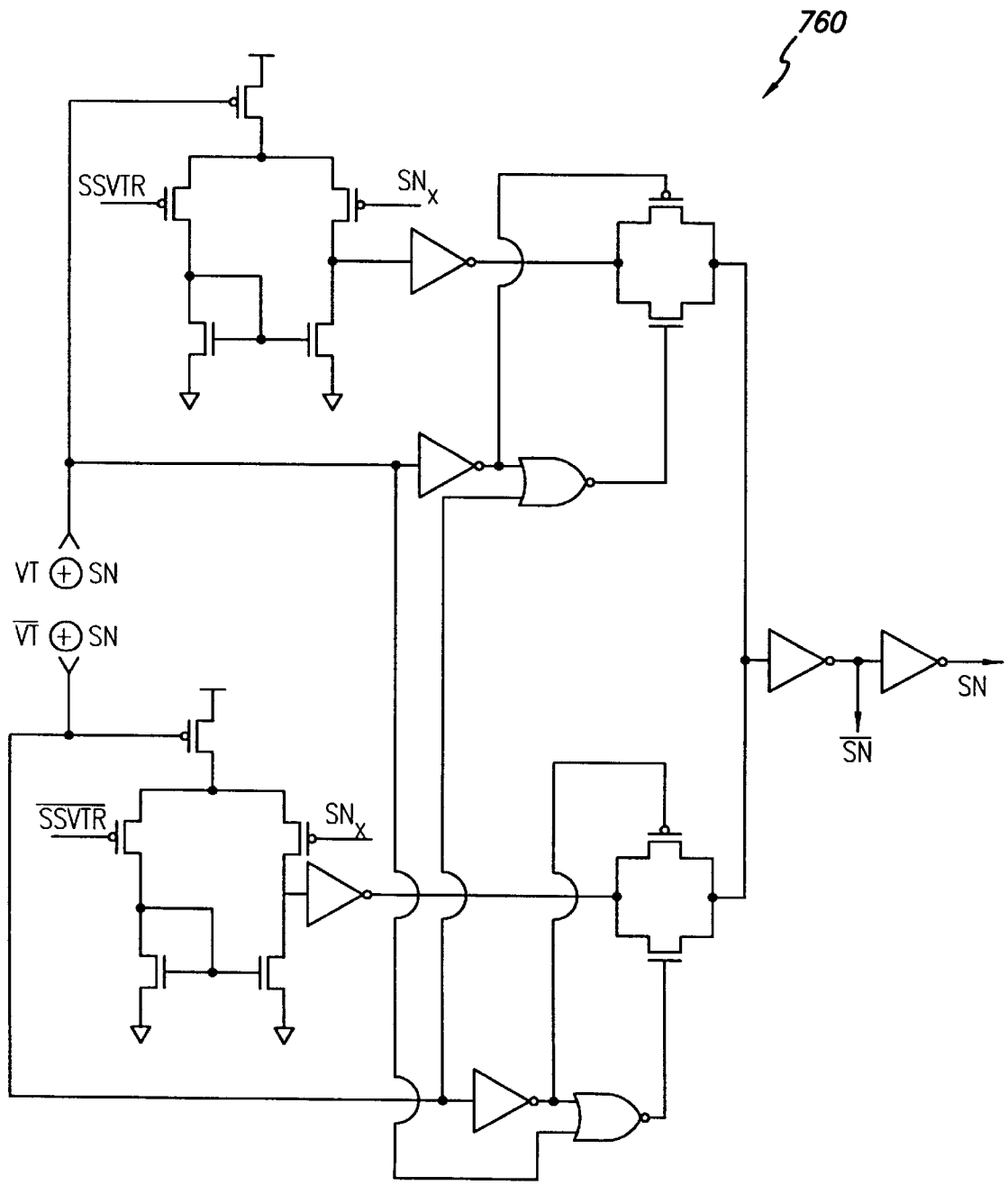
FIG. 7D is a schematic diagram illustrating a FIG. 4 single-ended signal receiver in a fourth embodiment.

Various embodiments are shown. FIG. 7A illustrates an always enabled differential amplifiers with only the transmission gates being selectively enabled for small device count and higher speed as alternative embodiment 700. FIG. 7B illustrates a differential amplifier and the transmission gates being enabled or disabled simultaneously as alternative embodiment 720. FIG. 7C illustrates a differential amplifiers being enabled by the same exclusive-OR for lower power, fast disabling of transmission gates during transition of exclusive-OR output and slow enabling of the transmission gates after the exclusive-OR is settled as alternative embodiment 740. FIG. 7D illustrates a P-channel differential amplifiers with 1.2V termination voltage for lower power applications as alternative embodiment 760. All differential amplifier gates can be disabled for power reduction when the receiver or when the device is not selected or the device is in deep power-down mode. The differential amplifier can be disabled by turning transistor T11 off.

By using a 1.2 v termination and receiver 405 as shown in FIG. 7D, the power consumption can be further reduced by another 33%. That is, the voltage swing will be from 1.2V to 0.7V, allowing decent margins from ground bounce and lower power consumption for portable systems. The operating frequency can be comparable with less number of devices on the buses, which is common with portable devices for smaller form factor. The transmitter 205 can still be an NMOS pull down T1 or parallel connection of NMOS pull downs 660. Receiver operation is similar except the differential amplifier 702 becomes a mirror image, thereby increasing the gate capacitance on signals going into the P-channel gate for comparable performance by approximately two times due to the increased device size of the P-channel. Other configurations of differential amplifiers, which convert small swing differential signals to large swing differential signals quickly, may alternatively be used instead of the differential amplifiers shown. One skilled in the art will recognize that another embodiment can use two different VTTs, one for signals equal to 1.8 v with 500 mv swing and another for oscillating reference signals equal to 1.7V with 300 mv swing. All signals transition at the same time and have similar slew rates. The same transmitter and receiver pair can manage the multiple VTT system.

It will be appreciated that the DC bias point of each differential amplifier in the receiver 405 is configured so that the receiver 405 output voltage is above half-VCC when both the small swing voltages (single-ended signal SNx and SSVTR or /SSVTR of the enabled differential amplifier) are close to VIH and below half-VCC when both the small swing voltages are close to VIL. This DC biasing allows for adequate margin and preservation of output signal SN when the single-ended signal SNx does not change state and the SSVTR or /SSVTR of the enabled differential amplifier is closing the differential signal before it is de-coupled.

Since the receiver 405 operates during the signal transition for a small swing single-ended signal, the concept of set-up and hold-time from a specified time after the signal level reaches VIH/VIL or VREF in previous signaling techniques no longer applies. Also, there is no VREF (reference voltage) for comparison with the signal voltage. By eliminating the timing necessary for set-up and hold and the timing needed to enable voltage margins for sensing around VREF, the operating frequency is considerably increased with lower power consumption. Further, all receivers 405 are self timed, without the need of a global clock, allowing the receivers 405 to be adjusted individually for elimination of board or package level transmission skew.

Figure 8A:
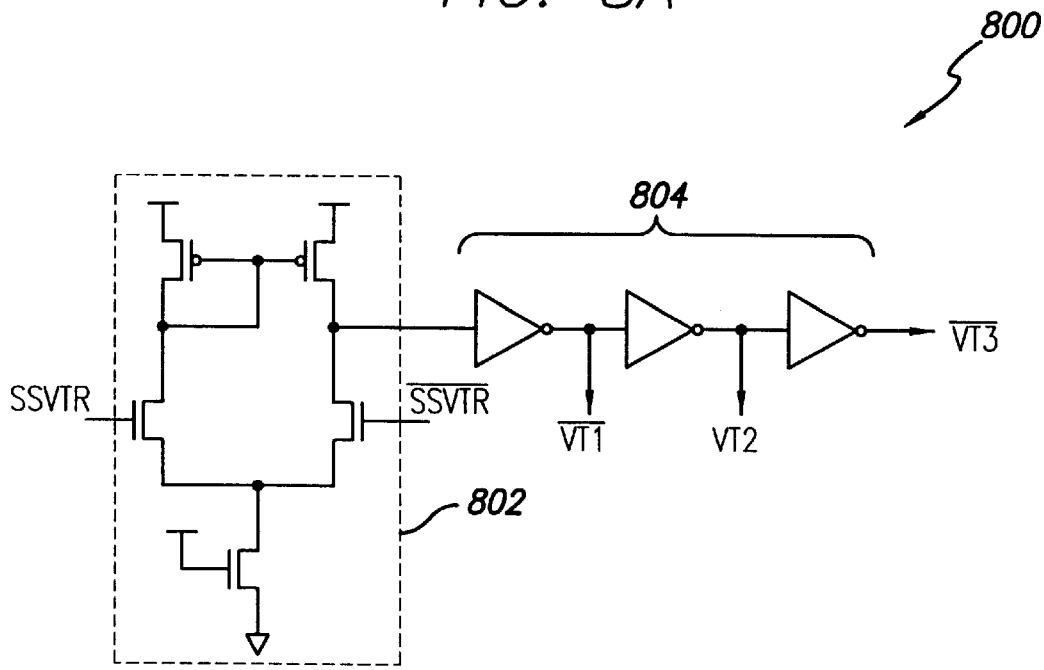
FIG. 8A is a schematic diagram illustrating circuit details of the SSVTR to /SSVTR comparator of FIG. 4.
Figure 8B:
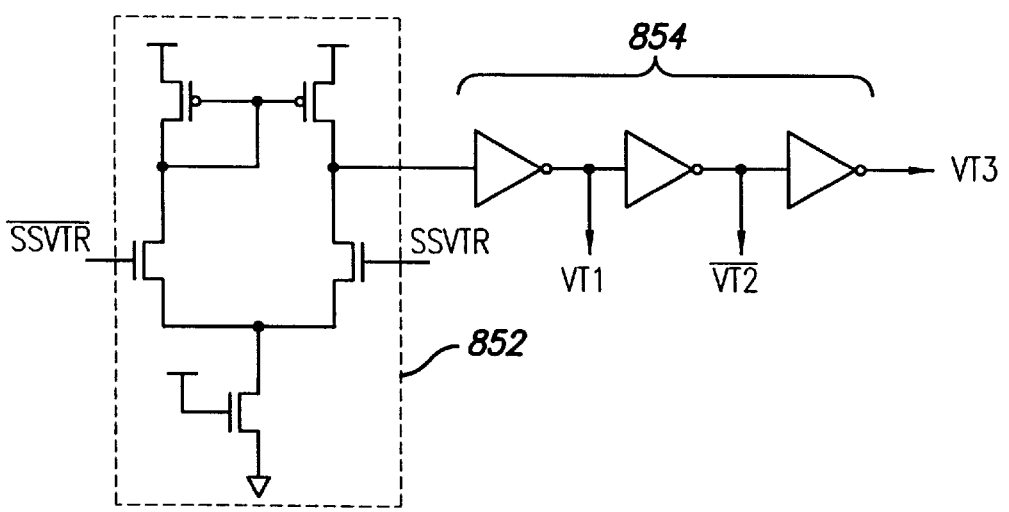
FIG. 8B is a schematic diagram illustrating circuit details of the /SSVTR to SSVTR comparator of FIG. 4.

FIGS. 8A and 8B are schematic diagrams illustrating circuit details comparators 435 of FIG. 4. Each comparator 435 includes a differential amplifier 802 (FIG. 8A) or 852 (FIG. 8B) similar to the differential amplifier 702 of FIGS. 7A and multiple inverters 804 (FIG. 8A) or 854 (FIG. 8B) in series. The full rail output signals of the comparators 802 and 852 (VT1, VT2, VT3, /VT1, /VT2 & /VT3) are transmitted to all the single-ended receivers' XORs 425 (FIG. 4). Selection of VT1, VT2 or VT3 is determined based on testing for signal speed substantially equal to that of the receiver 405 output signal SN generation path.

Figures 1, 9:
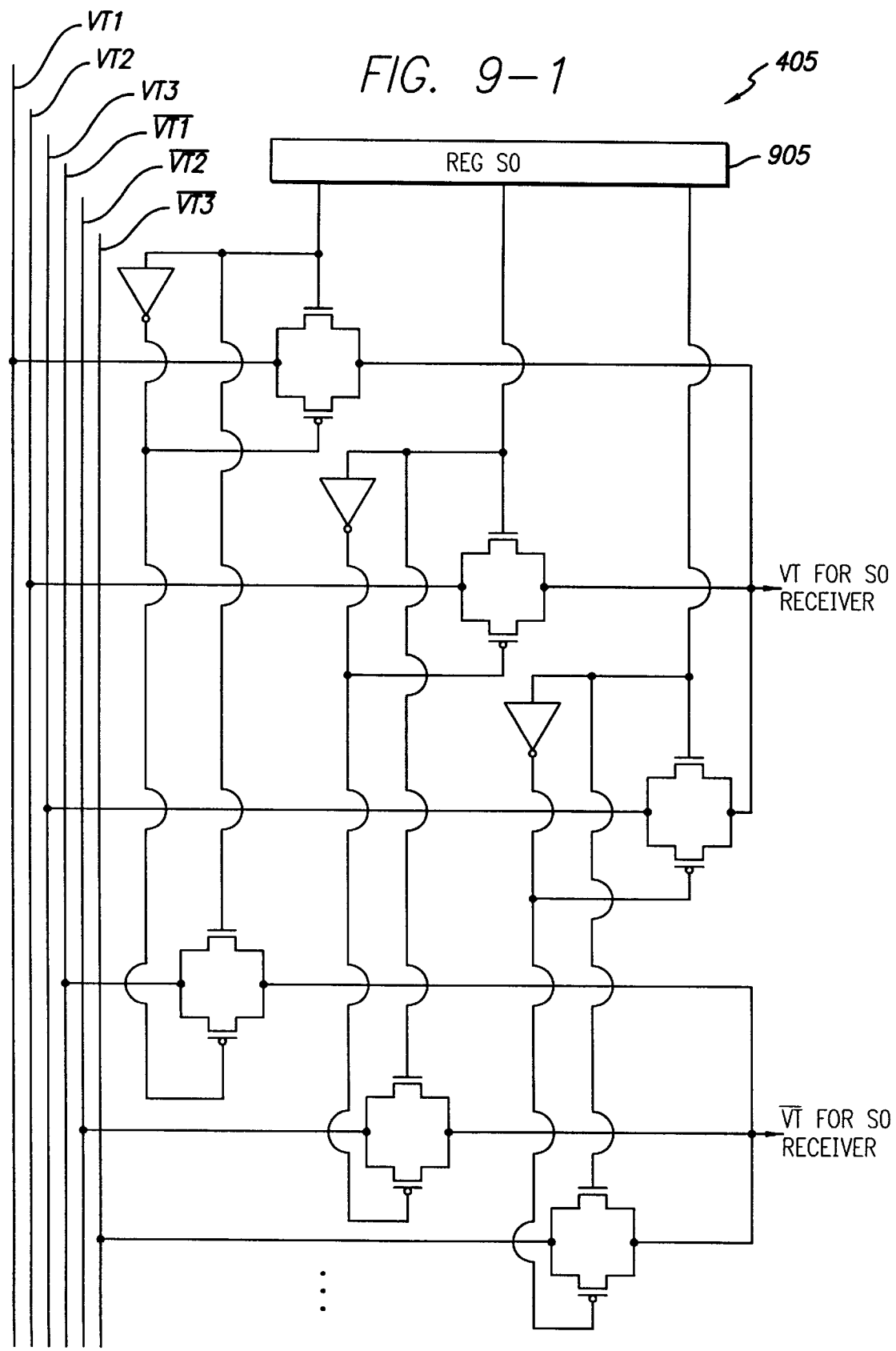
FIG. 9 is a schematic diagram illustrating receivers with individually adjustable delays to eliminate skew during transmission.

FIG. 9 is a schematic diagram illustrating receivers 405 with individually adjustable delays to eliminate skew during transmission and to convert small swing to large swing by comparators 410. To tune the operating frequency or voltage swing for optimum performance, each receiver 405 has a register 905 for storing data to enable delivery of one of the three VT1 & /VT1, VT2 & /VT2 or VT3 & /VT3 to the XOR 425 (FIG. 4).

Figure 11:
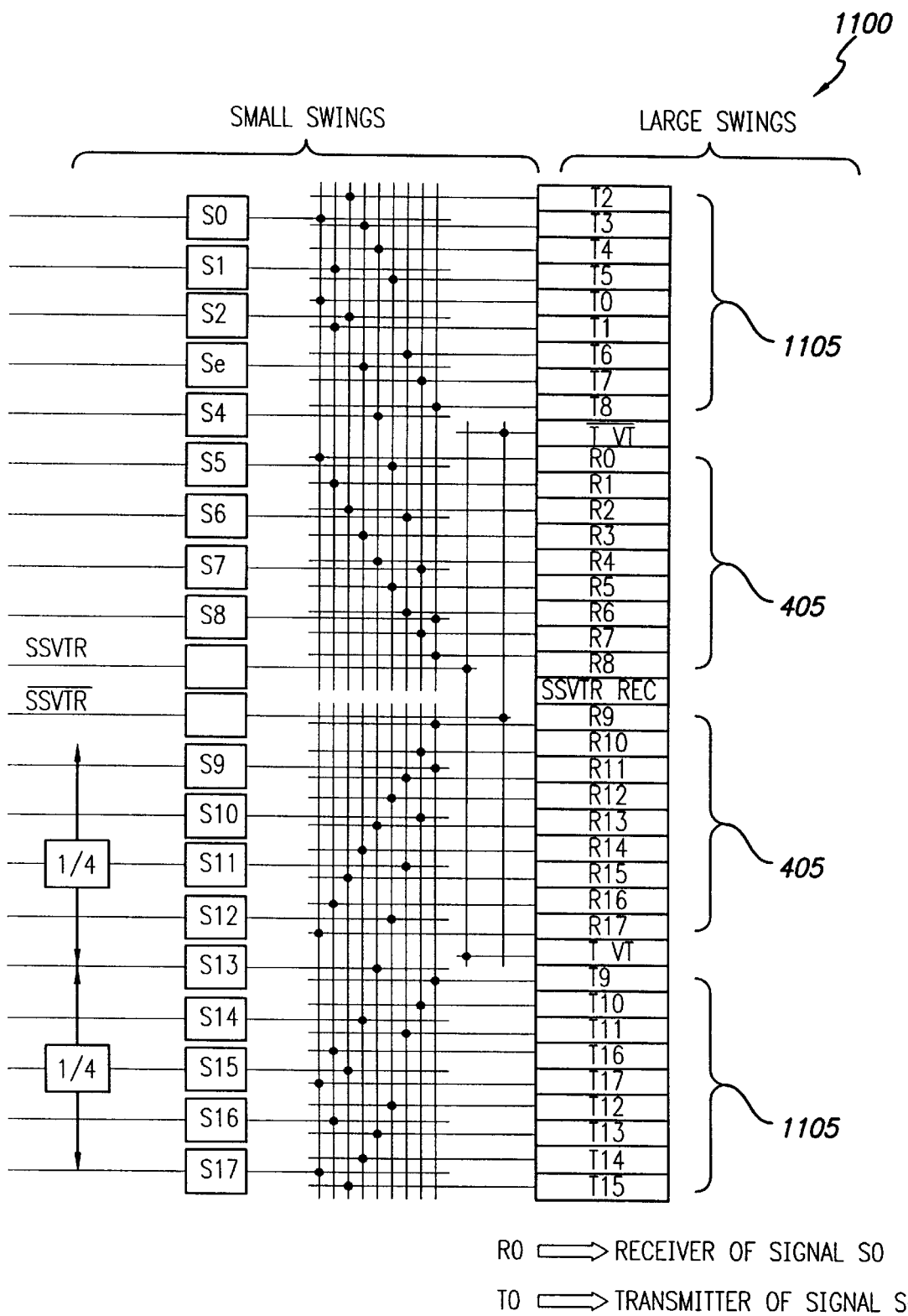
FIG. 11 is a perspective view of a hard-wire layout of the FIG. 2 system.

FIG. 11 is a perspective view of a hard-wire layout of a combined master 1100 for bi-directional signal communication. The master 1100 includes receivers 405 and return transmitters 1105 coupled together. More particularly, each single-ended signal received such as signal S0 is coupled to a corresponding receiver 405 such as receiver S0 and to a corresponding transmitter 1105 such as transmitter T0. Preferably, all single-ended signals SNx may be grouped together with a single pair of SSVTR and /SSVTR references. However, persons skilled in the art will recognize that, for a given operating frequency, SSVTR and /SSVTR loading and signal imbalance reduce the number of signals SNx that can be grouped together. As shown in FIG. 11, the layout is implemented so that the capacitances, resistances and inductances on SSVTR, /SSVTR and all single-ended signals SNx are balanced. Also, since SSVTR and /SSVTR go to all of the receivers 405, the total loading on SSVTR and /SSVTR needs to be minimized.

By using devices with very low power dissipation and close physical packing, the bus can be made as short as possible, which in turn allows for short propagation times and high data rates. As shown in FIG. 2B, the resistor-terminated controlled-impedance transmission lines can operate at signal rates of 1 Ghz (1 ns cycle). The characteristics of the transmission lines are strongly affected by the loading caused by integrated circuits like DRAMs mounted on the bus. These integrated circuits add lumped capacitance to the lines, which both lowers the impedance of the lines and decreases the transmission speed. In the loaded environment, the bus impedance is likely to be on the order of 25 ohms and the propagation velocity of 7.5 cm/ns. Care should be taken not to drive the bus from two devices at the same time. So for buses less than about 12 cm, one dead cycle (e.g., 2 ns) is needed to settle the bus for switching from one driver to another driver. For longer buses, more than one cycle may be needed for the signals to settle down before a new transmitter can drive the signal. Unlike RAMBUS, the length of the bus does reduce operating frequency in burst mode from the same device.

Figure 12A:
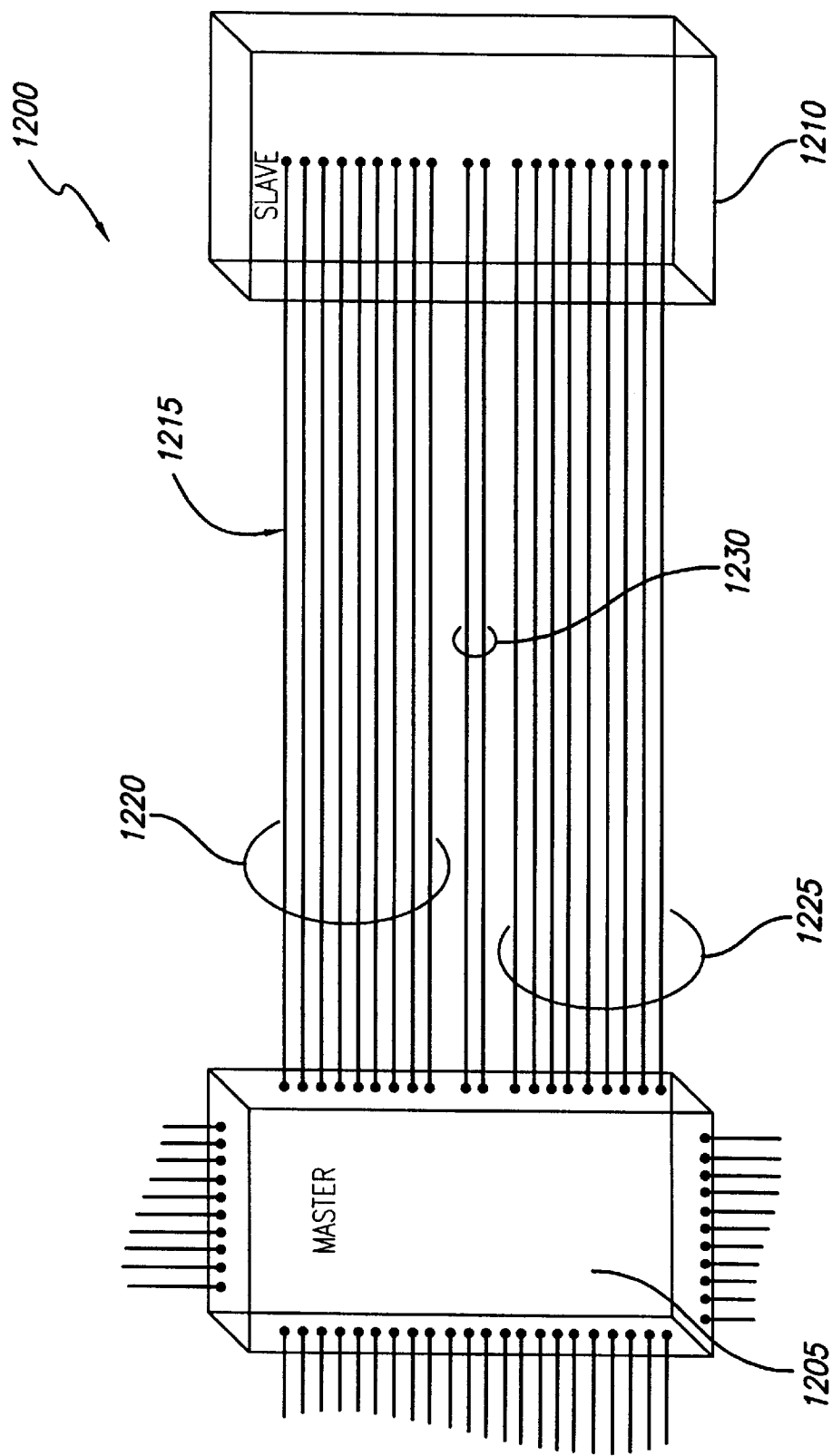
FIG. 12A is a block diagram illustrating a point-to-point system in accordance with this invention.
Figure 12B:
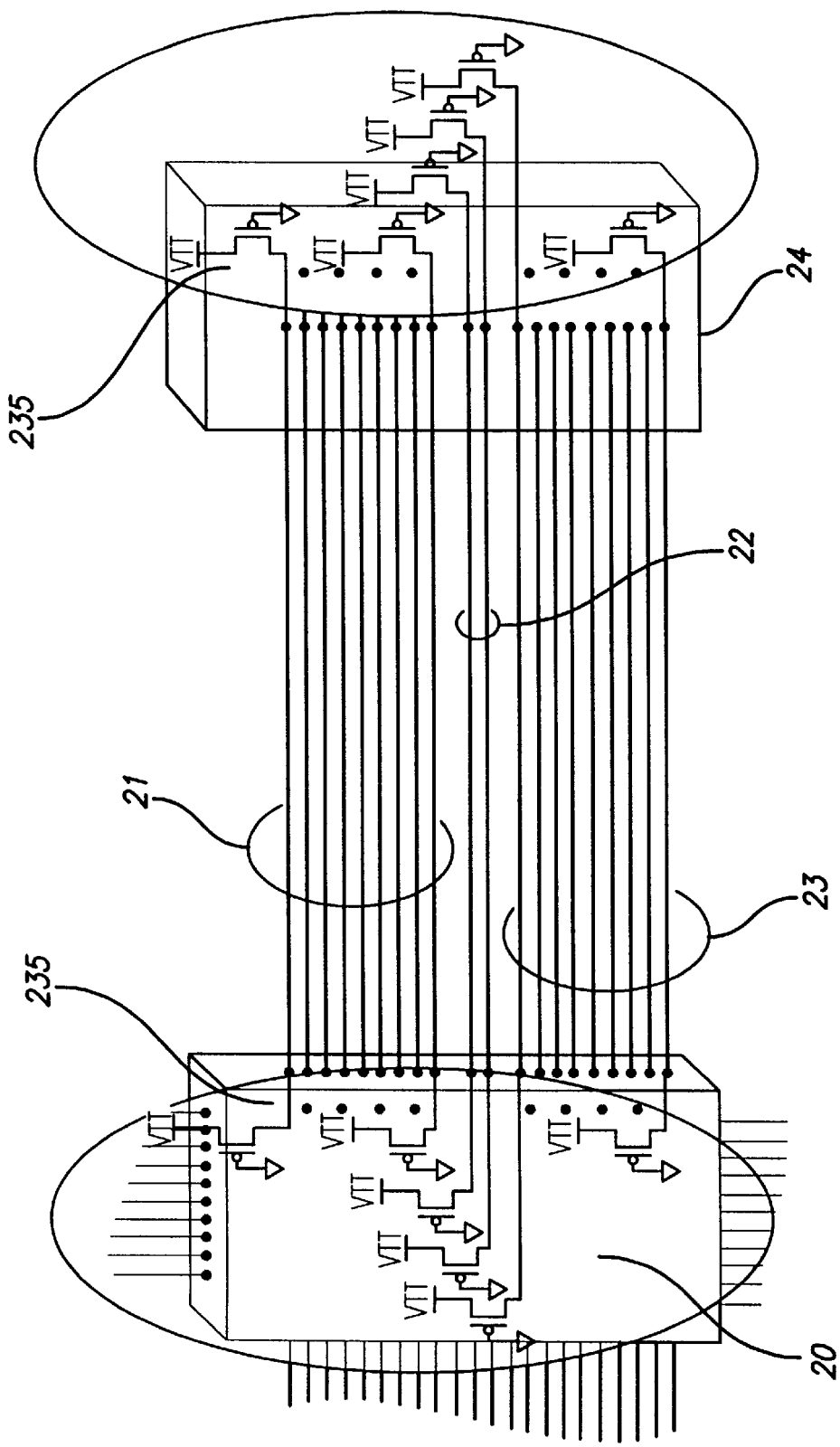
FIG. 12B is a block diagram illustrating the FIG. 12A point-to-point connection having impedance-matching grounded gate p-channel devices inside the integrated circuit.

FIG. 12A is a perspective view block diagram illustrating a point-to-point system 1200, which includes a bi-directional master 1205 coupled via transmission lines 1215 to a bi-directional slave 1210. The transmission lines 1215 includes upper signal SNx lines 1220, lower signal SNx lines 1225 and SSVTR and /SSVTR lines 1230. As illustrated in FIG. 12B is a perspective view block diagram illustrating point-to-point system 1200 incorporating terminating resistances 1235 internally using grounded gate P-channel devices. This eliminates the need for space to connect external resistances and reduces cost. It will be appreciated that the terminating resistances 1235 can be implemented using internal resistors instead of grounded gate P-channel devices. Terminating both ends with the appropriate characteristic impedance is preferable for bi-directional signals on a bus. Since intra-chip blocks are physically proximate, impedance matching resistances are unnecessary. Small pull-up devices are sufficient. Similarly, when inter-chip connections are physically proximate, impedance matching resistances can be replaced with small pull-up devices to reduce cost and power and to maintain the same slew rate.

Figure 13A:
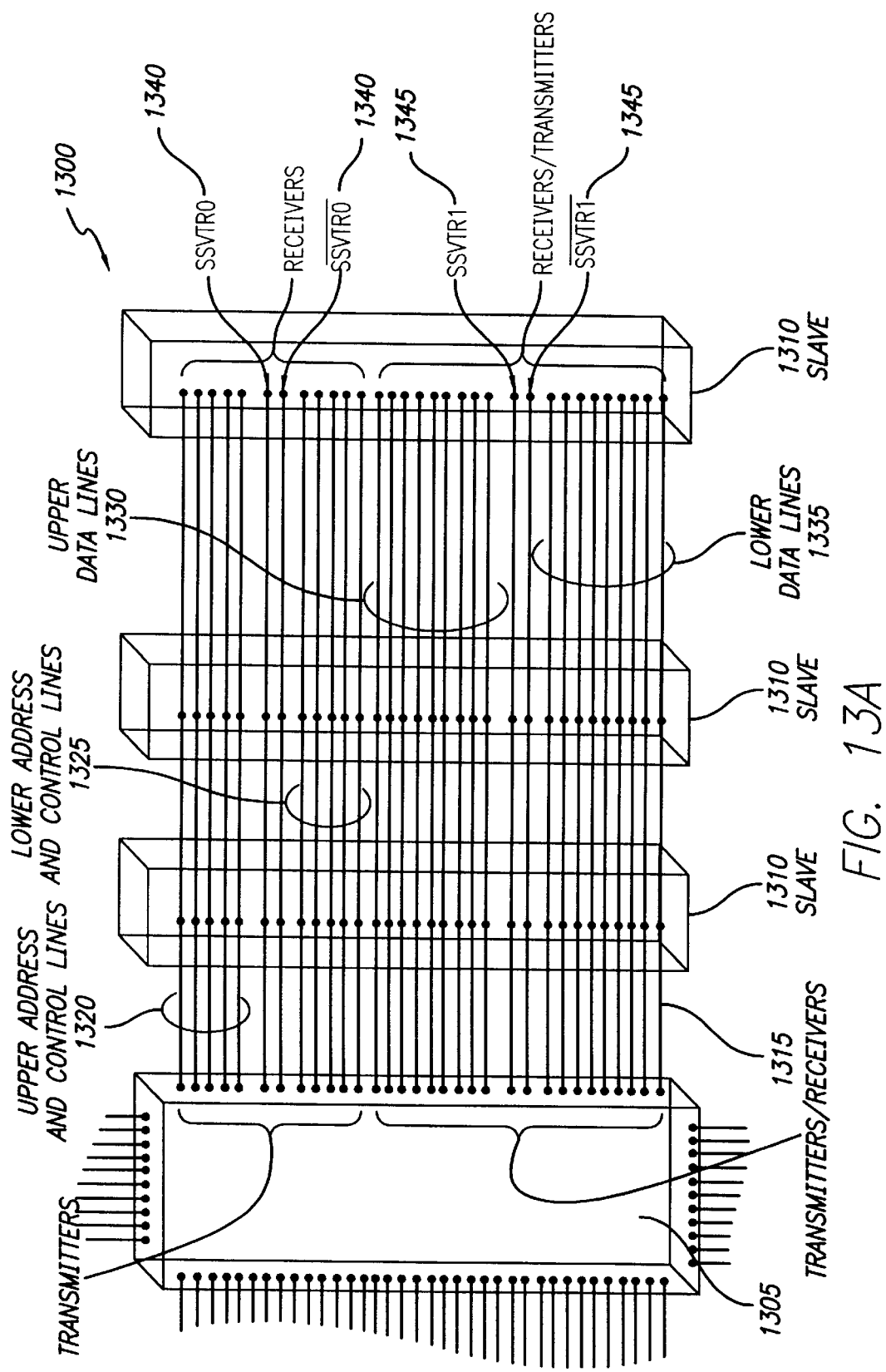
FIG. 13A is a perspective view block diagram illustrating a unidirectional signaling system and a bi-directional signaling system on a single integrated circuit.

It will be appreciated that multiple buses are required for devices like SLDRAM, DDR SDRAM or DDR SRAMs, where signals are transmitted and received simultaneously. FIG. 13A is a perspective view block diagram illustrating a combined unidirectional and bi-directional system 1300 for SLDRAM on a single integrated circuit. System 1300 includes a master 1305 (e.g., a memory controller) coupled via transmission lines 1315 to slaves 1310 (e.g., SLDRAMs). The master 1305 transmits address and control signals via address and control lines 1320 and 1325, transmits/receives data signals across data lines 1330 and 1335, transmits on SSVTR and /SSVTR lines 1340 a first set of SSVTR and /SSVTR references (i.e., SSVTR0 and /SSVTR0) for examining the address and control signals, and transmits a second set of SSVTR and /SSVTR references (i.e.,SSVTR1 and /SSVTR1) to the slaves 1310. The address and control portion of the system 1300 manage unidirectional signals needed only by the slaves 1310. The data portion of the system 1300 is bi-directional based on whether the control signal specified a READ or a WRITE operation.

For an SLDRAM, the 40-bit command and address is sent in a packet of four 10 bit words. SSVTR0 and /SSVTR0, which may be referred to as the system differential clock, operates at 500 Mhz. A Phase-Locked Loop (not shown) is used to lock the clock frequency and timing for various internal purposes and driving the data output with SSVTR1 and /SSVTR1 on both edges for a data rate of 1 Ghz. All the high frequency signals are terminated on both ends of the bus with their characteristic impedance. The termination on the memory controller end can include external resistances, internal resistances or internal grounded gate P-channel devices, since this memory controller is usually the master and is fixed. Since the number of components (SLDRAMs) 1310 (which operate like slaves) is variable, components 1310 are preferably terminated by external resistors at the end of the transmission lines. The-18 bit bi-directional data bus 1330 and 1335 operates at the same frequency as the system clock for synchronization and sends data in eight 18-bit words in four clock cycles (8 ns) or 2.25 gigabytes/sec from a single SLDRAM. Care is taken to balance the load on SSVTR0 and /SSVTR0 by adding dummy gates and lines to look comparable to SSVTR1 and /SSVTR1. This load balancing makes the slew rate due to loading be similar and allows similar margins for all signals.

Figures 14A, 14B:
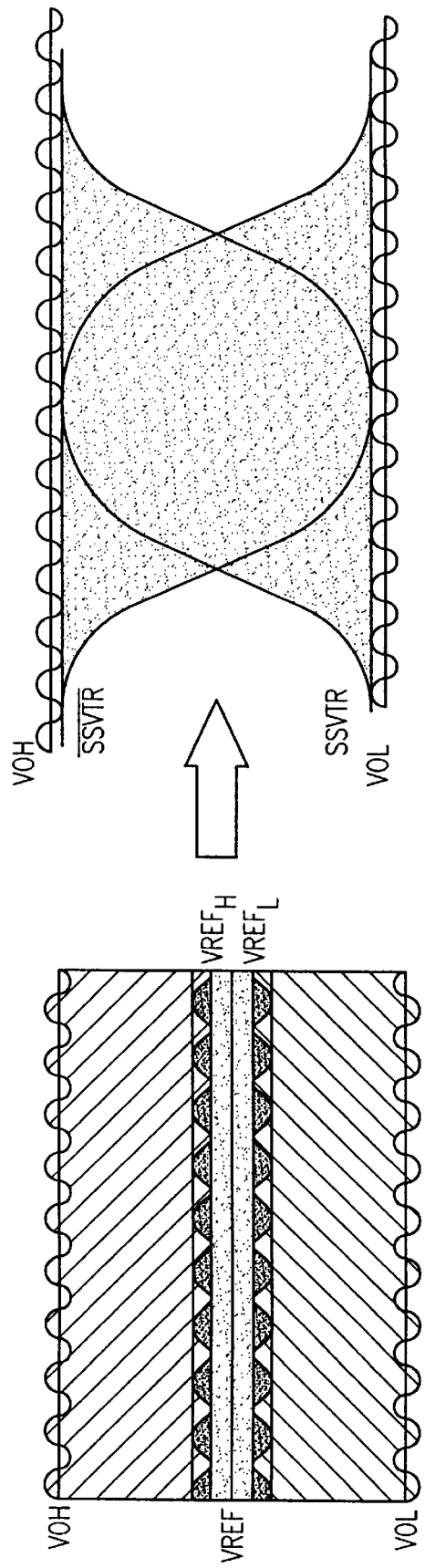
FIG. 14A illustrates a prior art fixed voltage reference whose value is around the midpoint of logic high voltage level and logic low level.
FIG. 14B illustrates complementary references which have the same voltage swing as any signal.

When higher bandwidth is required, a system 1350 can use four buses as shown in FIG. 14B. Two separate channels of SLDRAMs 1310 are used with a single memory controller 1305. This configuration allows 4.5 gigabytes/sec peak data bandwidth. Although the system 1350 does not require synchronous clocks for the transmitter 1305 or receiver 1310, the system 1350 can use synchronous clocks to transmit data at a particular time and frequency for ease of testing and usefulness with existing protocols of synchronous DRAMs and SRAMs. It may be desirable to use an on chip multiplier of a slow clock or an internal ring oscillator to transmit data at high frequency without a high speed clock for synchronization to reduce noise and system power. It will be appreciated that those skilled in the art can build on the teachings of this invention to achieve various size, synchronous or asynchronous, high bandwidth systems.

Five concepts further explaining the input and output circuitry 210 of FIG. 4 are provided below.

The first concept relates to having complementary references. As shown in the FIG. 14A, prior art systems use a fixed voltage reference "VREF" whose value is around the midpoint of logic high voltage level (VOH) and logic low level (VOL). The VREF generator (not shown) usually has some DC offset from the variation in power supply used for its generation, this variation illustrated as "VREFH" and "VREFL". It also has some AC noise due to instantaneous variations in power supply voltage, ground bounce, capacitive coupling and inductive coupling with adjacent signals. The differential swing to the comparator used in the receiver in the prior art is illustrated by the arrows. It should be noted that the worst case differential signal in the prior art will be on the order of ⅓ to ¼ of the total voltage swing of the signal.

As shown in FIG. 14B, the systems and methods of the invention use complementary references SSVTR and /SSVTR which have the same voltage swing as any signal (e.g., data or control). In a preferred embodiment, this voltage swing is 500 mv with a logic high voltage (VOH) of 1.8 v and a logic low level (VOL) of 1.3 v. It will be appreciated that the average of the complementary reference voltages is around the midpoint of VOH and VOL at every instant of time during operation of this signaling system. The signals and the complementary references have same transition times and voltage swings, and are initiated at the same time from the same source (same device for inter-chip or same general location for intra-chip) to be sent to the receiver. In other words, the complementary references look just like any other signal. However, the complementary references toggle every time other signals need to transmitted. Since the complementary references use the power supply and ground at the same time, all noise is common mode. Therefore, the VREF variations (VREFH and VREFL) of the signal swing needed in the prior art is unnecessary in the systems and methods of the present invention. Due to the binary nature of digital signaling, one complementary reference will always have opposite polarity to the signal at the start of the reference transition and at the end of the reference transition. Thus, one reference present will have a total swing of about 500 mv present at some time, thereby enabling the comparator to sense the signal voltage more easily than the prior art system which has only ⅓ to ¼ of the total signal swing. The signal and reference transition time can be half of the transition time needed by the prior art to achieve the same differential signal during signal change. Those skilled in the art will recognize that, for optimum performance, VOH and VOL should be set anywhere between a few hundred millivolts below the power supply and a few hundred millivolts above ground, with a difference between them of 500 millivolts. The difference can be further reduced to 200 mv to 300 mv if the device mismatches are reduced and signals have little or no reflections, especially in intra-chip communication.

The second concept relates to having dual comparators for each incoming signal. Referring again to FIG. 4, since the signal is compared to both of the complementary references, each receiver 210 has two comparators. One compares signal SNx to SSVTR and the other compares signal SNx to /SSVTR. At the start of a burst transition, the comparator with a full differential signal on its input is coupled to the receiver 210 output and the other comparator, which has no differential signal, is de-coupled from the receiver 210 output. This is done by initialization. If the signal SNx and the coupled reference transition, then the comparator quickly senses the signal as a differential amplifier, quickly amplifying the signal and driving the output to the opposite state. If the signal SNx does not transition (i.e., only the references transition), then the differential input to the comparator which is coupled at the beginning of the reference transition will steadily reduce through the transition time, eventually until no differential input is provided. The differential input to the comparator which is de-coupled at the beginning of the reference transition will steadily increase through the transition time, eventually until a full differential signal is provided. The originally coupled comparator with no differential signal at the end of the transition is de-coupled and originally de-coupled comparator with the full differential signal at the end of the transition is coupled. The present invention uses two comparators to sense one signal. Further, the binary nature of digital signals assures a full signal swing on one of the comparator at the start of every possible valid transition.

The third concept relates to initialization. Since only one comparator at a time is coupled to the receiver output, it is important for proper operation to have the comparator with the full differential input signal coupled to the receiver 210 output at the start of a burst. Therefore, all the signals S0x to SNx are initialized to the logic high level VOH. By turning off all the drivers, initializing the SSVTR to VOL, initializing the /SSVTR to VOH and connecting the signals to termination resistors or p-channel pull ups with their gates turned on and source connected to VTT (VTT is 1.8 v), power consumption is reduced. The receiver 210 outputs for S0 through SN are pre-charged high to VCC using p-channel device 1615 of FIG. 16 to ensure the steering logic (explained below) to couple the comparator with full differential signal to the receiver 210 output.

The fourth concept relates to signal change discrimination. As known by those skilled in the art, the characteristic of a differential amplifier is to amplify a small voltage difference to a large voltage difference. Voltage gain is typically from 3 to 5 times based on the device size and matching of the transistor. The inverter positioned after the differential amplifier provides additional gain to achieve almost the full swing based upon device size selection. The speed of the differential amplifier and of the inverter to achieve full swing depends on the differential signal available on its input. As shown in FIG. 15A, a differential amplifier (and an inverter) 1501 can amplify a transition in both SNx and SSVTR 1500 very quickly. But, when SNx does not transition, the signal to the differential amplifier reduces to just noise and the speed is much slower (based on mismatches and noise). The transitioning signal SN' (the output of the differential amplifier and inverter) is shown as dotted line 1503. The region 1502 to the left of line 1505, which defines the location where the XOR gate is slicing the gap is labeled "Change." The region to the right of the line 1505 is labeled "No Change." As stated above, when the signal does not transition, the amplifier 1501 reduces to just noise, which is indicated as an indeterminate region 1506. The period of time before the amplifier reaches the indeterminate region 1506 is indicated as temporal gap region 1504. This invention takes advantage of the time gap, by enabling the steering logic described below to pass the changing signal to the receiver output and to prevent the indeterminate signal from passing. By choosing proper device sizes and transition times, the time gap can be made sufficient to operate the steering logic such that a "signal change" is passed, but the "no signal change" and the resultant indeterminate voltage signal does not pass. It will be appreciated that some indeterminate voltage level can pass so long as it is less than the logic threshold of the XOR gate following it and the other comparator can restore the voltage level quickly. It will be further appreciated that the time gap is dependent on signal swing, reference signal transition time, process mismatch and signal reflection etc.

Figure 15B:
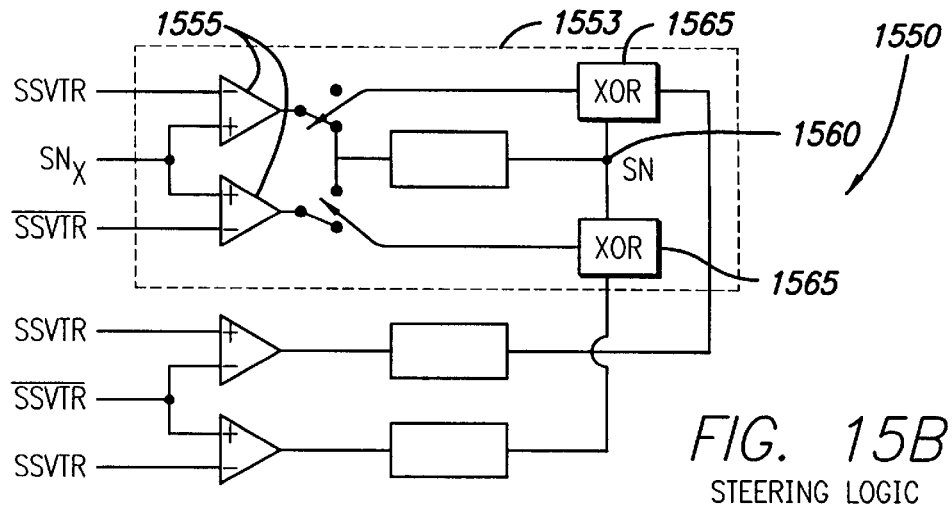
FIG. 15B is a block diagram illustrating the steering logic.

The fifth concept relates to steering logic. Referring to FIG. 15B, the steering logic circuit 1550 couples the appropriate comparator 1555 to the receiver output 1560, and is based on the timing generated by the differential amplifier using SSVTR, /SSVTR and the present output of the receiver 1553. The steering logic 1550 uses SSVTR, /SSVTR and the present output signal of the receiver 1553. Referring to FIG. 4, initializing input signals S0x through SNx to VOH, reference /SSVTR to VOH, reference SSVTR to VOL, and receiver output signals S0 through SN to VCC couples the appropriate comparators 410 to the receiver output 420 before the start of the burst. For a transitioning signal, the steering logic 1550 does not change, since the steering logic XORs 1565 selects the appropriate amplified reference and the signal receiver output. Since both the amplified SSVTR reference and SNx transition and the delay paths for the amplified SSVTR reference and for SNx to the XOR 1565 are identical, the XOR 1565 does not switch. Alternatively, if the incoming signal does not transition, the previous comparator 1555 which was coupled is de-coupled and the other comparator 1555 which was not coupled is now coupled. The signal receiver output does not change, and is actively driven by the coupled comparator 1555 to restore the output level if required. The steering logic 1550 is designed to occur during the time gap 1504 between signal change 1502 and no signal change 1506 as explained above.

The steering logic is done using an individual exclusive-OR locally for each comparator for higher speed, better adjustment of slicing time, and for improving margins or adjusting for skews and mismatches. It would also be possible to have all of comparators de-coupled from their receiver outputs using SSVTR and /SSVTR timing and one control signal for all the signal receivers of one bus channel to occur at slicing time during the time gap to reduce the number of devices in the receivers. This would reduce operating bandwidth, as the proper comparator has to be connected to receiver output before the start of next transition.

When all these elements are combined together, the whole signaling system works with all signal S0x through SNx & /SSVTR starting at VOH, all signal receiver output precharged to VCC and the SSVTR starting at VOL. Before the signal burst is initiated with transitioning of the complementary reference signals, all comparators with differential signal on them (SNx & SSVTR) are coupled to the receiver outputs. For signals transitioning, the steering logic allows the signals to drive the output to the opposite voltage rail. For signals not transitioning, the steering logic de-couples the signals from the present comparator to the other comparator to hold and/or restore the receiver output. The next transition is pipelined to continue with overlapping the transitions with steering logic until the steering logic delay limits the bandwidth or the time interval to allow the next transition.

Figure 16:
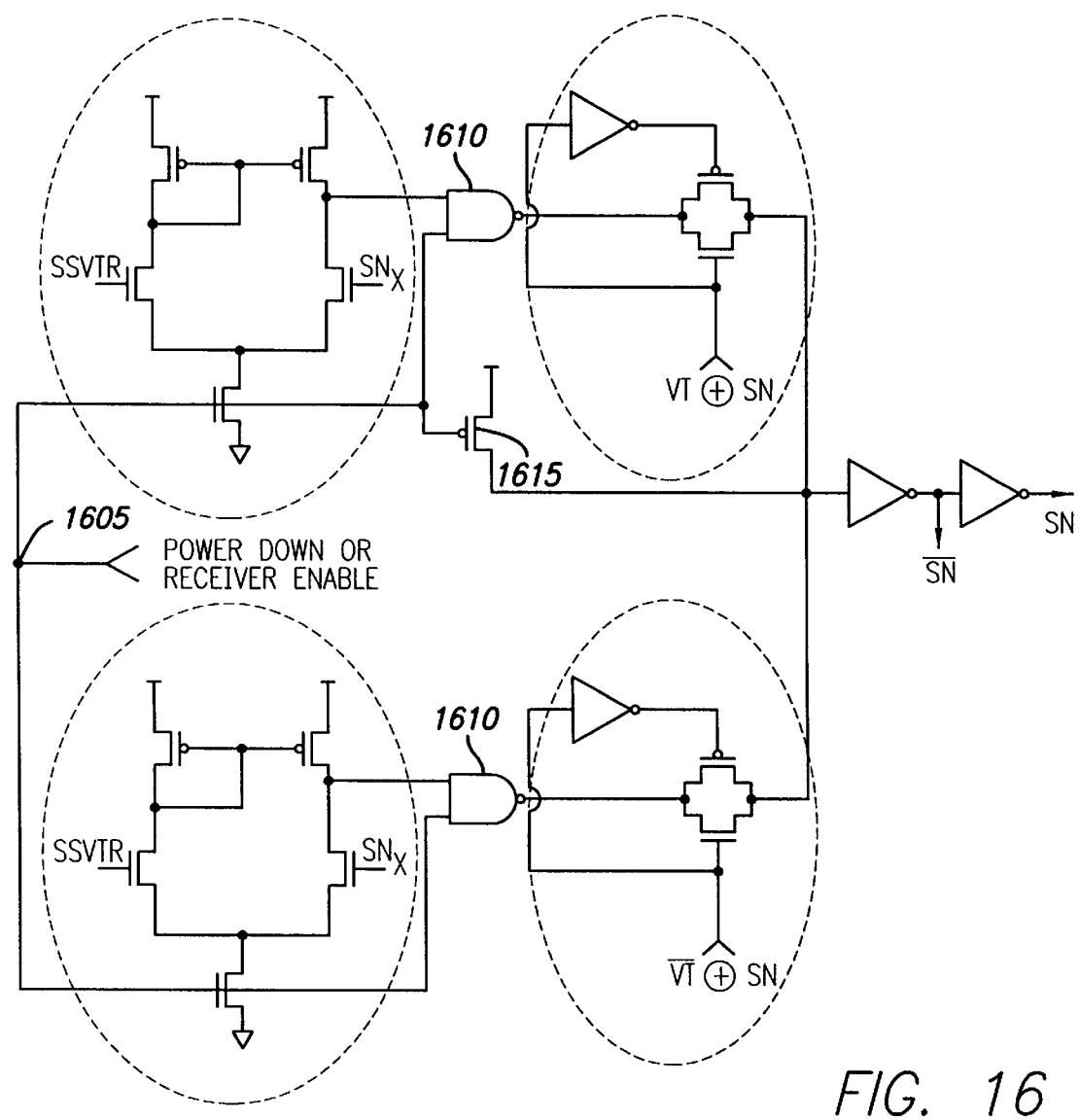
FIG. 16 is a circuit diagram illustrating the single-ended signal receiver with differential amplifiers gated by a power down or receiver enable signal for turning off the power to the receiver when not in use.

As shown in FIG. 16, the single-ended signal receiver has differential amplifiers gated by a power down or receiver enable signal for turning off the power to the receiver when not in use. Relative to FIG. 7A, the inverters have been replaced by NAND gates 1610 coupled to the power down or receiver enable signal. Further, a pull-up transistor 1615 has been coupled to node 708 at its drain, to VCC at its source, and to the power down or receiver enable signal at its gate to precharge SN to VCC. The NAND gate 1615 after the differential amplifiers also achieves the correct polarity on SN to initiate the burst cycle. The desired initial condition is to preset SNX high, with SNx pulled high by the termination resistance or pull-up device on the signal line and SSVTR low and /SSVTR high. The rest of the receiver operation is already described. The P-channel device on the common node of the transmission gates output is to precharge the node 708 high quickly if necessary during power up or when the exclusive-OR outputs have not reached stable levels.

By using devices with very low power dissipation and close physical packing, the bus can be made as short as possible, which in turn allows for short propagation times and high data rates. The terminated controlled impedance transmission lines, as shown in FIG. 12, can operate at signal rates of 1 GHz (1 ns) or higher. The characteristics of the transmission lines are strongly affected by loading caused by integrated circuits, like RAMs, mounted on the bus. These integrated circuits add lumped capacitance to the lines, which lowers the impedance of the lines and decreases the transmission speed. In the loaded environment, the bus impedance is likely to be on the order of 25 ohms and the propagation velocity of 7.5 cm/ns. In an application requiring fast bus turnaround from read to write or vice versa, as shown in FIG. 17, the signal transition time is chosen to be about 25 to 30% of the signal rate (half the cycle time). Amplification is initiated in the next 25 to 30% of the signal rate. The driver is turned off to settle the signals down in about the next 25 to 30% of the signal rate. It will be appreciated that the next cycle, where the signal or data direction is reversed, can be performed without loss of bus efficiency where the devices are close to each other and the bus settling time is less than half of the signal rate.

Figure 13B:
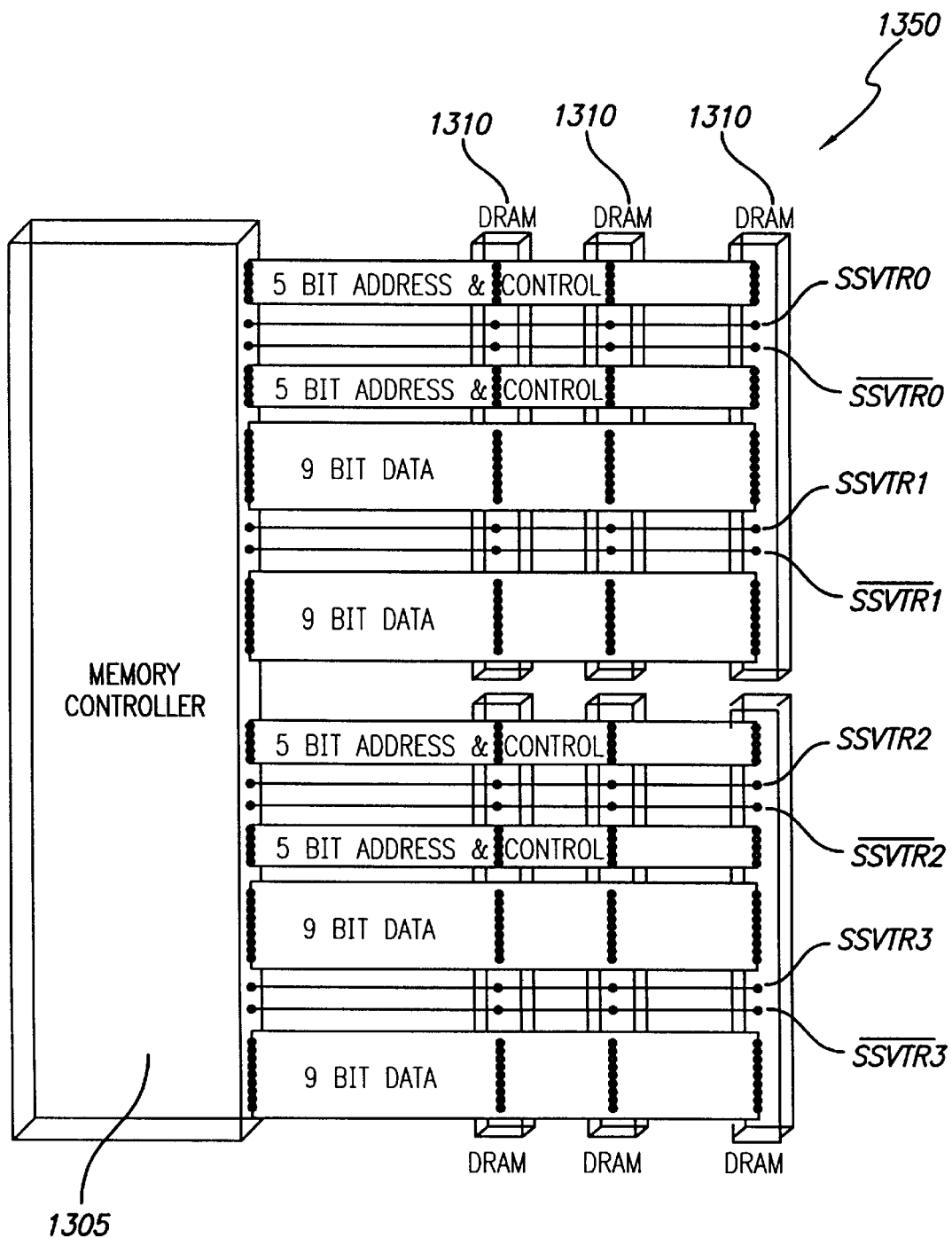
FIG. 13B is a perspective view block diagram illustrating four signaling systems on a single integrated circuit.
Figure 18:
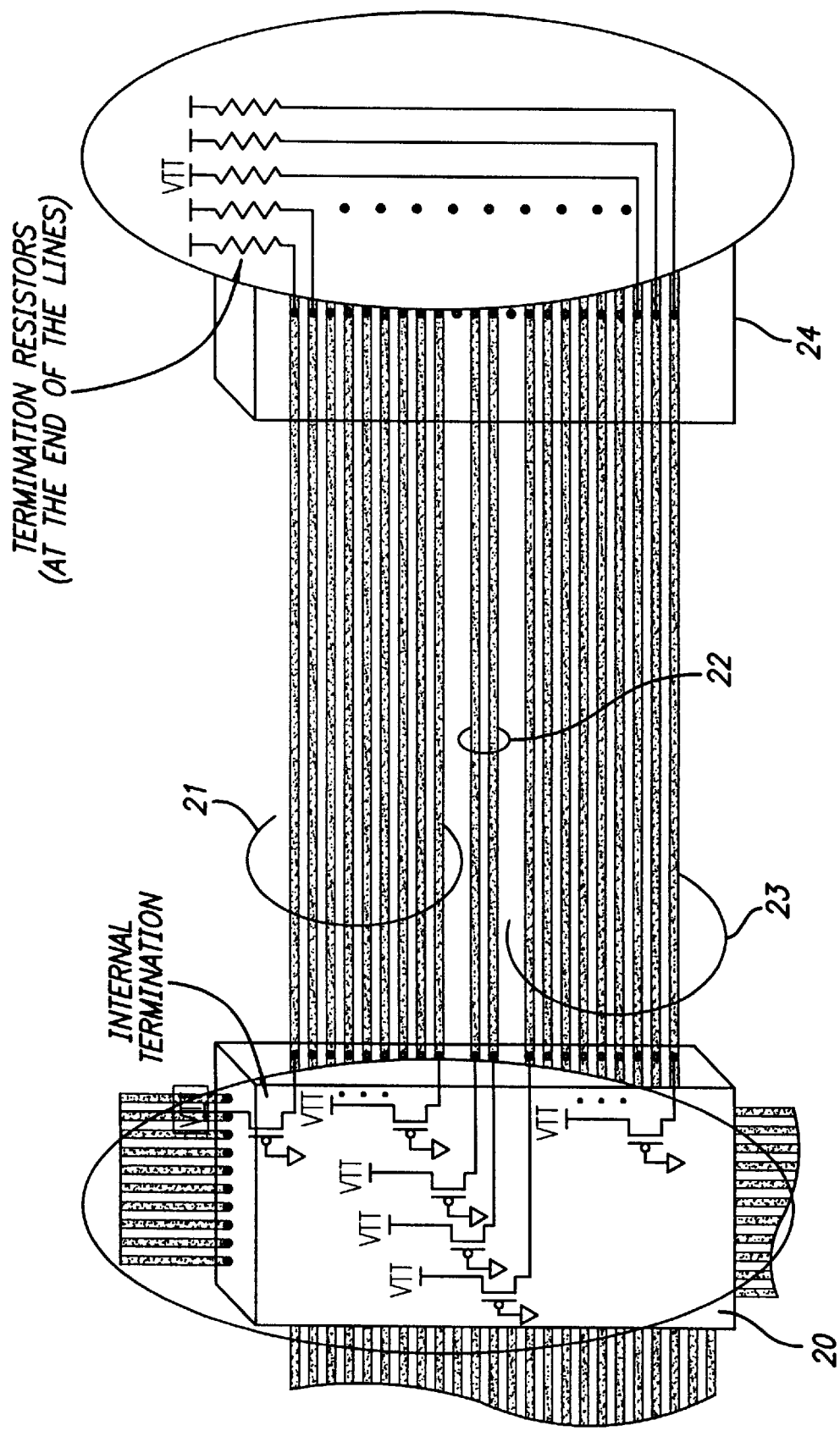
FIG. 18 is a block diagram illustrating a point to point system.

FIG. 18 shows a point to point perspective. By incorporating the terminating resistance internally using grounded gate P-channel devices, high performance point to point systems can be built as shown in FIG. 13B. Internally incorporating terminating resistances eliminates the need for space to connect the external resistances and reduces cost. It is also possible to switch the gate of P-channel devices on the transmitter side to reduce the current required in discharging the signals lines to the desired voltage. Both the CPU and the memory controller have P-channel terminating devices whose sizes may be chosen to equal the characteristic impedance of the line when their gates are at ground potential. The gates of the P-channel devices use a signal which is a complement of the receiver enable to disable the receiver end and the transmitting end. This switching can be done while the receiver is preset high, and before the burst is initiated on the signal lines. Internal resistances can also be used instead of grounded gate P-channel devices. By using multiple buses as described in the next section, a CPU to memory controller bus width can be reduced to 32 (36) from 64 (72) or the bandwidth can be increased considerably. The backside cache connection of CPUs can also be sped up, the number of pins on the CPU can be reduced and the PBSRAMs can be changed from X36 to X18 thereby reducing die size and cost.

FIG. 19 shows a system 1900 having multiple buses for devices like SLDRAM, DDR SDRAM or DDR SRAMs, where signals are received simultaneously. The system clock bus 1920 starts from a clock source 1915 at the end opposite the memory controller 1905, is connected to all devices 1910 whose data outputs are connected to the bus 1920, and terminates at the memory controller 1905. The loading on the clock signal is matched with the loading on the data output and the SSVTR1 and /SSVTR1 references. It will be appreciated that the clock can be differential (preferably) or single-ended depending upon the clock frequency and system requirements. The clock voltage swing can be similar to SSVTR and /SSVTR to have a similar receiver. To have the same delay, the trace length of the clock bus 1920 is matched with the trace length of the SSVTR1 and /SSVTR1 references. The clock source 1915 introduces SSVTR1, /SSVTR1 and the data from DDRDRAM's at different times depending on their location on the bus 1920, so that the data, SSVTR1 and /SSVTR1 arrive at the controller 1905 at about the same time regardless of which DDRDRAM is driving the data. Each DDRDRAM could optionally use a DLL (delay lock loop) to reduce the clock 1915 to data delay if needed for synchronization at the controller 1905. To reduce an additional pin in the clocked system where the data transmission is predictable, a DLL may be used to generate /SSVTR1, having the same timing and voltage characteristic but of opposite polarity, at the receiver end. The DLL would reproduce the clock in all components (including the controller 1905 and DDRDRAMs 1910). The controller would be aware of the cycle in which the data and the SSVTR1 reference is predicted to arrive. After a write cycle is initiated by address and command signals, the DDRDRAM would know the cycle in which the input data is going to arrive. The DLL gates the /SSVTR1 signal only when the signal is needed by the particular component. The address and command lines may be grouped with SSVTR0 and /SSVTR0. The address and control bus unidirectionally carries input signals from the memory controller 1905 to the DDRDRAMs 1910. The 10-bit command and address is sent in as a 2-bit command and an 8-bit address. The 2-bit command is done by using /CE and /RAS on one signal on the two edges of SSVTR0 and /SSVTR0 and the other signal for /CAS and /WE. The 8-bit address on two edges gives up to 16 bits of row address occurring with /CE and /RAS or up to 16 bits of column and block address occurring with /CE and /CAS for read cycle. The write cycle is done with 16 bits of column and block address with /CE, /CAS and /WE, SSVTR0 and /SSVTR0 may be derivative of the system clock (differential) and operating at the same or a multiple of the frequency of the system clock. As explained earlier, a DLL may be used to lock the clock frequency in the memory controller 1905 for various internal purposes, to drive the command and address signals during read requests, and to drive data-in, SSVTR1 and /SSVTR1 for write requests.

Using different references for data-in (SSVTR1 and /SSVTR1) and for address and control (SSVTR0 and /SSVTR0) further distinguishes the present invention from RAMBUS signaling. In RAMBUS, all signals coming into the RDRAM are sensed based on a single clock, whereas in the present invention the control signals and address signals are on a different channel than the data signals. This enables running the control and address channel at a different frequency than the data channel. All unidirectional high frequency signals (address and control signals) terminate with their characteristic impedance on the end of the bus away from the controller 1905. Since the controller 1905 is usually the master and is usually fixed, all bi-directional signals (data signals) terminate on the controller end with an external or internal resistance or with an internal grounded gate P-channel device. It will be appreciated that, to reduce power, the terminating P-channel device can be switched off during the data write cycle. The termination on the controller side is optional and may be a high resistance around 10× the characteristic impedance. Since the number of memory components, i.e., slaves, is variable, the memory components are preferably terminated by an external resistor at the end of the transmission line. The 18-bit bi-directional data bus preferably operates at the same frequency as the system clock for synchronization and preferably sends data from a single DDRDRAM in four 18-bit words in 2 clock cycles (4 ns) or 2.25 gigabytes/sec. Care is taken to balance the load on SSVTR0 and /SSVTR0 by adding dummy gates and line to look comparable to SSVTR1 and /SSVTR1. This load balancing makes the slew rates similar and allows similar margins for all signals. When higher bandwidth is required, three buses can be used as shown in FIG. 20. Two separate channels of DDRDRAM's are used with a single memory controller. This configuration allows a 4.5 gigabyte/sec-peak data bandwidth. The address and command signals may be shared between the two channels on the SSVTR0 and /SSVTR0. The clock and data are split to have 36-bit data bus using SSVTR1, /SSVTR1, SSVTR2 & /SSVTR2. This saves pins as compared to prior art of dual channel RDRAM's.

Although the invention does not require a synchronous clock for the transmitter or the receiver, it can use a synchronous clock to transmit data at a particular time and frequency for ease of testing and useful with existing protocols of synchronous DRAMs and SRAMs. It may be desirable to use an on chip multiplier of a slow clock or an internal ring oscillator to transmit data at high frequency without a high speed clock for synchronization to reduce noise and system power. Those skilled in the art can build various size, synchronous or asynchronous, high bandwidth systems in accordance with the teachings herein.

The foregoing description of the preferred embodiments of the present invention is by way of example only, and other variations and modifications of the above-described embodiments and methods are possible in light of the foregoing teaching. For example, although the system and method have been described as transmitting SSVTR and /SSVTR from a master 205 to a receiver 405, one skilled in the art will recognize that one reference may be sent and the complement generated on the receiver 405 side. Using the technique with other technologies, such as bipolar or gallium arsenide, which have similar switching devices and gates, can alternatively be used. Components of this invention may be implemented using a programmed general purpose digital computer, using application specific integrated circuits, or using a network of interconnected conventional components and circuits. The embodiments described herein are not intended to be exhaustive or limiting. The present invention is limited only by the following claims.

What is claimed is:

1. A system, comprising:
   a control bus having a master end and a slave end;
   a first reference bus having a master end and a slave end;
   a first reference transmitter coupled to the master end of the first reference bus for transmitting an oscillating reference thereon;
   a data bus having a master end and a slave end;
   a second reference bus having a master end and a slave end;
   a second reference transmitter coupled to the master end of the second reference bus for transmitting an oscillating reference thereon;
   a third reference transmitter coupled to the slave end of the second reference bus for transmitting an oscillating reference thereon;
   a master device coupled to the master end of the control bus for transmitting a control signal onto the control bus, coupled to the master end of the data bus for transmitting a first data signal associated with the control signal to the data bus and for receiving a second data signal responsive to the control signal from the data bus, and coupled to the master end of the second reference bus for receiving and using the oscillating reference from the third reference transmitter to detect a transition in the second data signal; and
   a slave device coupled to the slave end of the control bus for receiving the control signal from the master device, coupled to the slave end of the first reference bus for receiving and using the oscillating reference from the first reference transmitter to detect a transition in the control signal, coupled to the slave end of the data bus for receiving the first data signal associated with the control signal from the master device and for transmitting the second data signal responsive to the control signal to the master device, and coupled to the slave end of the second reference bus for receiving and using the oscillating reference from the second reference transmitter to detect a transition in the first data signal.

2. The system of claim 1, wherein the control bus has a first load and the data bus has a second load.

3. The system of claim 2, wherein the first load equals the second load.

4. The system of claim 2, wherein the first load is different than the second load.

5. The system of claim 1, further comprising a second data bus for carrying a third data signal associated with the control signal.

6. The system of claim 1, wherein each of the control bus, the first reference bus, the data bus and the second reference bus has a terminal resistance internally at the master end and a terminal resistance externally at the slave end.

7. The system of claim 1, further comprising a second slave device coupled to the control bus for receiving a control signal from the master device, coupled to the first reference bus for receiving the oscillating reference from the first reference transmitter, coupled to the data bus for receiving a data signal from and transmitting a data signal to the master device, and coupled to the second reference bus for receiving the oscillating reference from the second reference transmitter.

8. The system of claim 7, further comprising
   a clock bus coupling the first slave device to the second slave device in turn to the master device; and a clock source for generating a clocking signal on the clock bus to enable substantially simultaneous receipt of signals from the first and second slave devices at the master device.

9. A method comprising:
using a master device to transmit a control signal via a control bus to a first slave device;
transmitting a first oscillating reference for detecting transitions in the control signal via a first reference bus to the first slave device;
using the master device to transmit a first data signal associated with the control signal via a first data bus to the first slave device;
transmitting a second oscillating reference for detecting transitions in the first data signal via a second reference bus to the first slave device;
providing a second slave device between the master device and the first slave device;
providing a clock bus coupled from the first slave device to the second slave device in turn to the master device; and
generating a clocking signal on the clock bus to enable substantially simultaneous receipt of signals at the master device from the first and second slave devices.

10. A method comprising:
using a master device to transmit a control signal via a control bus to a first slave device;
transmitting a first oscillating reference for detecting transitions in the control signal via a first reference bus to the first slave device;
using a master device to receive a first data signal responsive to the control signal via a first data bus from the first slave device;
using a master device to receive a second oscillating reference for detecting transitions in the first data signal via a second reference bus from the first slave device;
providing a second slave device between the master device and the first slave device;
providing a clock bus coupled from the first slave device to the second slave device in turn to the master device; and
generating a clocking signal on the clock bus to enable substantially simultaneous receipt of signals from the first and second slave devices at the master device.

11. A system, comprising:
a control bus port;
a first reference bus port;
a first reference transmitter coupled to the first reference bus port for transmitting an oscillating reference;
a first data bus port;
a second reference bus port;
a second reference transmitter coupled to the second reference bus port for transmitting an oscillating reference; and
a master device coupled to the control bus port for transmitting a control signal to the control bus port, coupled to the first data bus port for transmitting a first data signal associated with the control signal to the first data bus port and for receiving a second data signal responsive to the control signal from the first data bus port, and coupled to the second reference bus port for receiving and using an incoming oscillating reference from the second reference bus port to detect a transition in the second data signal.

12. The system of claim 11, wherein the control bus port has a first load and the data bus port has a second load.

13. The system of claim 12, wherein the first load equals the second load.

14. The system of claim 12, wherein the first load is different than the second load.

15. The system of claim 11, further comprising a second data bus port coupled to the master device, wherein the master device transmits a third data signal associated with the control signal to the second data bus port and receives a fourth data signal responsive to the control signal from the second data bus port.

16. The system of claim 11, wherein each of the control bus port, the first reference bus port, the data bus port and the second reference bus port has an internal terminal resistance.

17. The system of claim 11, further comprising a slave device coupled to the control bus port for receiving a control signal from the master device, coupled to the first reference bus port for receiving the first oscillating reference from the first reference transmitter, coupled to the first data bus port for receiving a first data signal from and transmitting a second data signal to the master device, and coupled to the second reference bus port for receiving the second oscillating reference from the second reference transmitter.

18. The system of claim 17, further comprising a clock bus port for receiving a clocking signal via the clock bus port from the slave device.

19. A system, comprising:
a control bus port;
a first reference bus port;
a data bus port;
a second reference bus port;
a first reference transmitter coupled to the second reference bus port for transmitting an oscillating reference to the second reference bus port; and
a first slave device coupled to the control bus port for receiving a control signal from the control bus port, coupled to the first reference bus port for receiving and using an oscillating reference from the first reference bus port to detect a transition in the control signal, coupled to the data bus port for receiving a first data signal associated with the control signal from the data bus port and for transmitting a second data signal responsive to the control signal to the data bus port, and coupled to the second reference bus port for receiving and using the oscillating reference from the second reference bus port to detect a transition in the data signal.

20. The system of claim 19, wherein the control bus port has a first load and the data bus port has a second load.

21. The system of claim 20, wherein the first load equals the second load.

22. The system of claim 20, wherein the first load is different than the second load.

23. The system of claim 19, further comprising a second data bus port coupled to the first slave device for receiving a third data signal associated with the control signal and for transmitting a fourth data signal responsive to the control signal.

24. The system of claim 19, wherein each of the control bus port, the first reference bus port, the data bus port and the second reference bus port has an external terminal resistance.

25. The system of claim 19, further comprising
a clock bus port; and
a clock source for generating a clocking signal from the clock bus port to the master device.

* * * * *